US008803703B2

(12) United States Patent
Mitchell et al.

(10) Patent No.: US 8,803,703 B2
(45) Date of Patent: Aug. 12, 2014

(54) ELECTRONIC CIRCUITRY FOR HIGH-TEMPERATURE ENVIRONMENTS

(75) Inventors: David J. Mitchell, Oviedo, FL (US); John R. Fraley, Fayetteville, AR (US); Jie Yang, Fayetteville, AR (US); Cora Schillig, Orlando, FL (US); Bryon Western, West Fork, AR (US); Roberto Marcelo Schupbach, Fayetteville, AR (US)

(73) Assignees: Siemens Energy, Inc., Orlando, FL (US); Arkansas Power Electronics International, Inc., Fayetteville, AR (US)

( * ) Notice: Subject to any disclaimer, the term of this patent is extended or adjusted under 35 U.S.C. 154(b) by 309 days.

(21) Appl. No.: 13/547,380

(22) Filed: Jul. 12, 2012

(65) Prior Publication Data

US 2013/0002358 A1    Jan. 3, 2013

Related U.S. Application Data

(63) Continuation-in-part of application No. 12/192,324, filed on Aug. 15, 2008, now Pat. No. 8,223,036, and a continuation-in-part of application No. 13/537,572, filed on Jun. 29, 2012, and a continuation-in-part of application No. 13/537,208, filed on Jun. 29, 2012.

(51) Int. Cl.
    *H04Q 9/00*     (2006.01)
(52) U.S. Cl.
    USPC ................................................. 340/870.07
(58) Field of Classification Search
    USPC ................................................. 340/870.07
    See application file for complete search history.

(56) References Cited

U.S. PATENT DOCUMENTS

| 3,277,280 | A | 10/1966 | Staples et al. |
| 3,330,941 | A | 7/1967 | Del Duca |
| 3,750,635 | A * | 8/1973 | Hoffman et al. ............... 123/357 |
| 4,523,811 | A | 6/1985 | Ota |
| 5,440,300 | A | 8/1995 | Spillman, Jr. |
| 5,892,150 | A | 4/1999 | Isono et al. |
| 6,365,494 | B2 | 4/2002 | Rupp et al. |
| 6,838,157 | B2 | 1/2005 | Subramanian |
| 7,132,883 | B2 | 11/2006 | Huijsing et al. |
| 7,317,356 | B2 * | 1/2008 | Ananth .......................... 330/253 |
| 7,696,817 | B1 | 4/2010 | Boucher et al. |
| 8,023,269 | B2 | 9/2011 | Mitchell et al. |
| 8,033,722 | B2 | 10/2011 | Kulkarni et al. |
| 8,092,080 | B2 | 1/2012 | Mitchell et al. |
| 2002/0097095 | A1 | 7/2002 | Jeon et al. |
| 2004/0113790 | A1 * | 6/2004 | Hamel et al. ............... 340/572.1 |

(Continued)

OTHER PUBLICATIONS

Deanna, Russell G., Nasa TM-2000-209815. Wireless Telemetry for Gas-Turbine Applications, Mar. 2000.

(Continued)

*Primary Examiner* — Scott Bauer

(57) ABSTRACT

A circuitry adapted to operate in a high-temperature environment of a turbine engine is provided. A relatively high-gain differential amplifier (102) may have an input terminal coupled to receive a voltage indicative of a sensed parameter of a component (20) of the turbine engine. A hybrid load circuitry may be coupled to the differential amplifier. A voltage regulator circuitry (244) may be coupled to power the differential amplifier. The differential amplifier, the hybrid load circuitry and the voltage regulator circuitry may each be disposed in the high-temperature environment of the turbine engine.

27 Claims, 12 Drawing Sheets

(56) References Cited

U.S. PATENT DOCUMENTS

| | | |
|---|---|---|
| 2004/0189394 A1 | 9/2004 | Koimori et al. |
| 2005/0019867 A1 | 1/2005 | Kojima et al. |
| 2005/0198967 A1 | 9/2005 | Subramanian |
| 2009/0121896 A1 | 5/2009 | Mitchell et al. |
| 2010/0019404 A1 | 1/2010 | Crosnier et al. |
| 2010/0039289 A1 | 2/2010 | Mitchell et al. |
| 2010/0039290 A1 | 2/2010 | Mitchell et al. |
| 2010/0078202 A1 | 4/2010 | Mitchell |

OTHER PUBLICATIONS

Patil, "Silicon Carbide JFet Integrated Circuit Technology for High-Temperature Sensors", Department of Electrical Engineering and Computer Science, Case Western Reserve University, May 2009, pp. 1-158 (pp. I-XX are cover page and table of contents), Cleveland, OH.

Neudeck et al, "Extreme temperature 6H-SiC JFET integrated circuit technology", Phys. Status Solidi A 206, No. 10, pp. 2329-2345 (2009)/DOI 10.1002/pssa.200925188, Cleveland, OH.

Tomana et al., "A Hybrid Silicon Carbide Differential Amplifier for 350° C Operation", IEEE Transactions on Components, Hybrids, and Manufacturing Technology, vol. 16, No. 5, Aug. 1993, pp. 536-542, Auburn, AL.

Yang et al, "An All Silicon Carbide High Temperature (450+° C) High Voltage Gain AC Coupled Differential Amplifier", Materials Science Forum vols. 679-680 (2011) pp. 746-749, Mar. 28, 2011 at www.scientific.net © (2011) Trans Tech Publications, Switzerland, doi: 10.4028.

Neudeck, "Silicon Carbide Integrated Circuit Fabricated and Electrically Operated for 2000 hr at 500° C", http://www.grc.nasa.gov/WWW/RT/2007/Inst-Cnt/17-RIS-neudeck.html, pp. 1-4, Nov. 7, 2008, Ohio Aerospace Institute (OAI) Brook Park, OH.

Seitz, "Designing with Thermocouples", Technology edge, © National Semiconductor Corporation 2009, Application Note AN-1952, pp. 1-3, Santa Clara, CA.

Meijer et al., "Features and limitations of CMOS Voltage References", Delft University of Technology, Faculty Information Technology and Systems, circa 2000, pp. 17-23, The Netherlands.

Thomas et al., "Optimization of SiGe bandgap-based circuits for up to 300° C operation", Solid-State Electronics 56 (2011) pp. 47-55, © 2010 Elsevier Ltd., Atlanta, GA.

"Voltage References", MT-087 Tutorial, Rev. 0, 10/08, WK, pp. 1-18, copyright 2009 Analog Devices, Inc.

\* cited by examiner

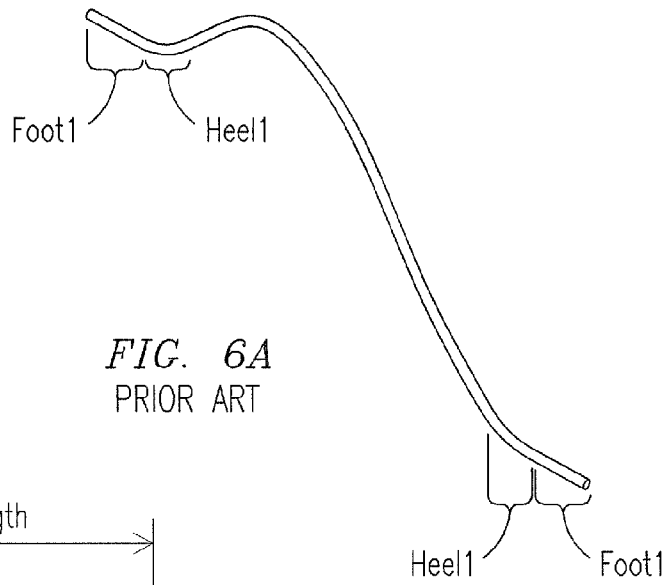
FIG. 6A
PRIOR ART
FIG. 6B
PRIOR ART
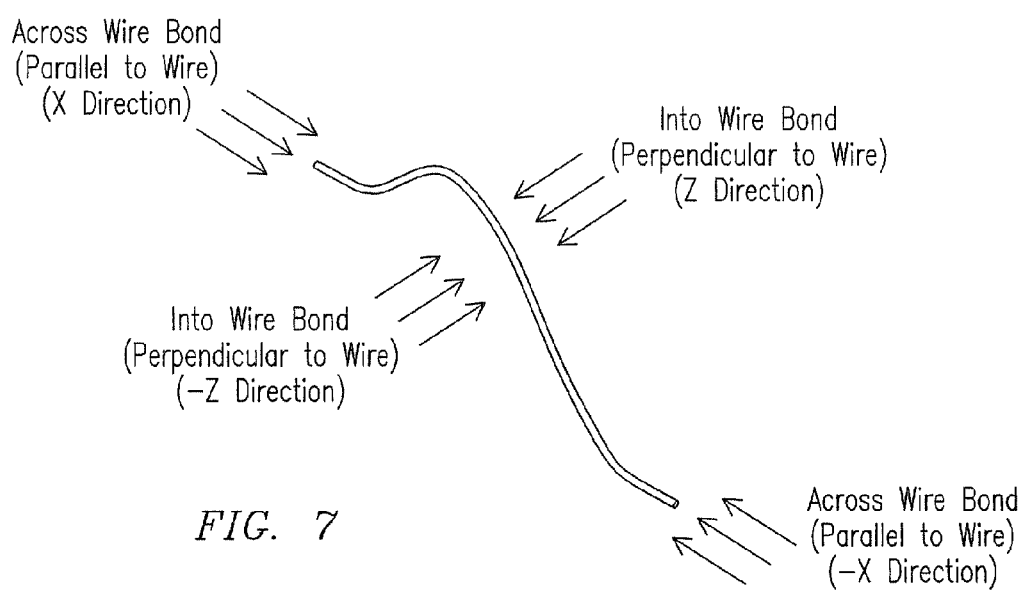
FIG. 7

ELECTRONIC CIRCUITRY FOR HIGH-TEMPERATURE ENVIRONMENTS

This application is a continuation-in-part of U.S. patent application Ser. No. 12/192,324 filed on Aug. 15, 2008 now U.S. Pat. No. 8,223,036, Ser. No. 13/537,572 filed on Jun. 29, 2012, and also Ser. No. 13/537,208 filed on Jun. 29, 2012, each of which is incorporated by reference herein in its entirety.

FIELD OF THE INVENTION

The present invention generally relates to wireless telemetry electronic circuitry for measuring component strain and in particular to electronic circuitry that is capable of operating in high temperature environments exceeding 300° C. and capable of withstanding forces up to at least 1000 g's.

BACKGROUND OF THE INVENTION

The temperatures inside an operating gas turbine engine are extremely high, often at levels in excess of 450° C. When it is desirable to monitor the inside temperatures of components of the turbine, such as a turbine blade, or to monitor stresses placed upon such components during operation, a special sensing, amplifying and transmitting circuit is required. Wireless telemetry circuit boards and components thereon that can withstand high temperatures can enable the extraction of data from stationary and moving components in high temperature environments, such as those experienced in internal combustion gas turbine engines. Electronic circuitry offer the possibility for real-time monitoring of component conditions during operation of turbine engines, such as industrial gas turbines, aircraft engines, and turbines used in the oil and gas industry. Knowing the condition of components in a turbine offers many benefits, including optimizing turbine operation based on internal engine parameters and enabling condition-based maintenance. Significant reductions in operation costs of advanced turbine engines may be realized by the use of monitoring devices. The current practice of instrumenting turbine components involves mounting sensors to components, running lead wires to routers and bringing large bundles of lead wires long distances out of the turbine to a monitoring location. The process is slow, labor intensive, expensive, and requires modification of many of the components of the turbine in order to allow for the inclusion of all of the lead wires.

In order to realize the advantage of extracting data from such a sensor system, it may be required to place the data transmitter on the coolest region of a hot component. This could result in the need for a wireless telemetry system that would function at temperatures exceeding 300° C., such as at the root of a blade in the flow path of a turbine engine. Current state of the art circuits using silicon or silicon-on-insulator (SOI) active components are not capable of operation at such high temperatures. Such a wireless telemetry circuit board would require a package, a board, runs, passive devices, active devices and connections capable of operating at temperatures exceeding 300° C.

BRIEF DESCRIPTION OF THE DRAWINGS

The invention is explained in the following description in view of the drawings that show:

FIGS. 6A and 6B are views of wire bonding techniques typically used in the semiconductor arts.

FIG. 7 is a perspective view showing g-force analysis of a typical wire bonding.

DETAILED DESCRIPTION OF THE INVENTION

Figure 1:
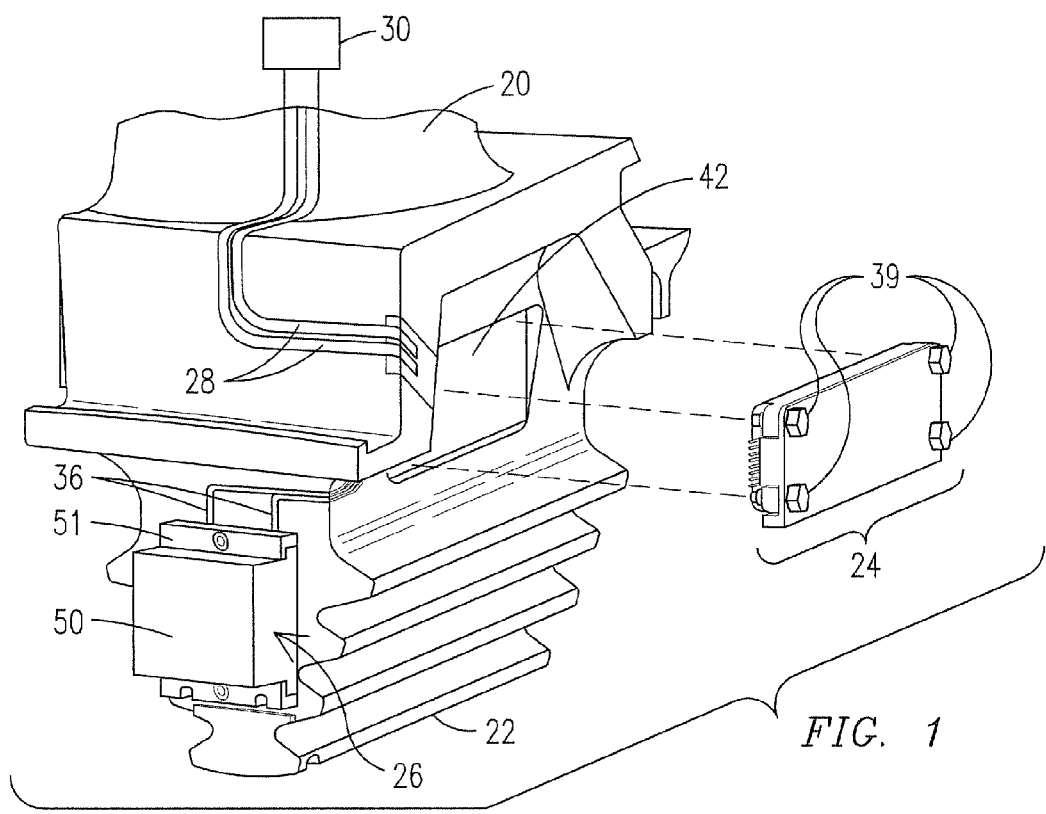
FIG. 1 is a partial perspective view of an exemplary turbine blade illustrating attachment of electronics including the telemetry circuit board.

Embodiments disclosed herein enable transmission of data via wireless telemetry by the use of an electronic circuit from regions of a gas turbine with temperatures ranging from ambient to greater than 300° C., and including temperatures up to at least 450° C. All of the elements of the circuit and package therefore are to be fabricated from materials capable of operation at temperatures greater than 300° C. Current state of the art high temperature electronic systems are designed such that the control logic circuits are placed in a location cool enough to use silicon-based electronics, or high temperature silicon-on-insulator (HTSOI) technology capable of operation at elevated temperatures up to a maximum of 300° C. In such a current state of the art system, the control signals are sent from a region of relatively low temperature, via a wire, to a power amplification module that is located in the hot region, at temperatures greater than 300° C. The power amplification module is a circuit that would employ semiconductors designed for high temperature use, such as wide band gap semiconductor materials including SiC, AlN, GaN, AlGaN, GaAs, GaP, InP, AlGaAs, AlGaP, AlInGaP and GaAsAlN, or other high temperature capable semiconductor materials that may be used at temperatures greater than about 300° C. This type of design strategy is not useful for incorporating instrumentation on a rotating hot section component, such as a gas turbine blade, because the entirety of the transmitter electronic circuitry must be located on the turbine blade, and thus operate at temperatures exceeding 300° C. New electronic circuits are disclosed herein that enable both sensor signal acquisition and wireless transmission at temperatures greater than 300° C. and including temperatures up to at least 450° C.

The disclosed electronic circuit and package therefore are fabricated from materials capable of operation at high temperature, for example temperature capable epoxy or ceramic materials, such as alumina, zirconia, silicon carbide, silicon nitride, aluminum nitride, etc. The conductors are fabricated from metals that can withstand high temperature without melting, such as silver or gold. Active and passive electrical components must be selected based upon the electrical requirements and the temperature environment in which the board will operate. High temperature passive components, such as thick film resistors based on systems such as palladium, ruthenium, iridium, rhenium, multilayer ceramic capacitors such as NP0, COG and X7R may be employed. High temperature capable inductors may need to be deposited directly onto the PC board supporting the electronic circuit, if suitable inductors are not commercially available. The active components, i.e., transistors, diodes, etc., may be fabricated from semiconductor materials capable of operating at high temperatures, such as those listed above. Connections between components and the electronic circuitry could likewise be made from high temperature metals, such as gold or platinum in the form of die attach, wire bonding, or any other appropriate method. In the case where the limits of monolithic high temperature bonding materials are exceeded, attachment may be performed using alloy compositions. In order to reduce the temperature to which the devices are exposed during attachment, a eutectic alloy composition may be used for attachment, followed by a heat treatment to change the attachment composition to one with a higher melting temperature. All materials on the board must be selected such that exposure to the required operating temperatures does not result in chemical interactions or compositional/structural changes that degrade the performance of the board. A complete circuit capable of transmitting a signal from a thermocouple or strain gauge sensor has been designed in accordance with the present disclosure using the types of high temperature passive and active electronic materials that are currently available or are under development.

With reference to FIG. 1, embodiments of the present invention allow for transmitting sensor data from a rotating component, such as a turbine engine blade 20 having certain electronic components located on root 22 of the blade, which operates in an environment having a temperature exceeding 300° C. For purposes of the disclosure herein, the term "high temperature" without additional qualification will refer to any operating environment, such as that within portions of a combustion turbine, having a maximum operating temperature exceeding 300° C.

Embodiments of the present invention provide components for use in a combustion turbine instrumented with telemetry systems that may include one or more sensors, lead lines connecting sensors with at least one telemetry transmitter circuit, at least one transmitting antenna, a power source and at least one receiving antenna. FIG. 1 illustrates the turbine blade 20, a wireless telemetry transmitter assembly 24 and a rotating antenna assembly 26. Lead lines or connectors 28 may extend from one or more sensors, such as sensor 30, to telemetry transmitter assembly 24 when mounted proximate blade root 22. Lead lines 28 may route electronic data signals from the sensor 30 to telemetry transmitter assembly 24 where the signals are processed by a telemetry transmitter circuit formed on a circuit board contained within an electronics package 34 shown in FIG. 2. Lead lines or electrical connectors 36 may be deposited for routing electronic data signals from a telemetry transmitter circuit to the rotating antenna assembly 26.

Figure 2:
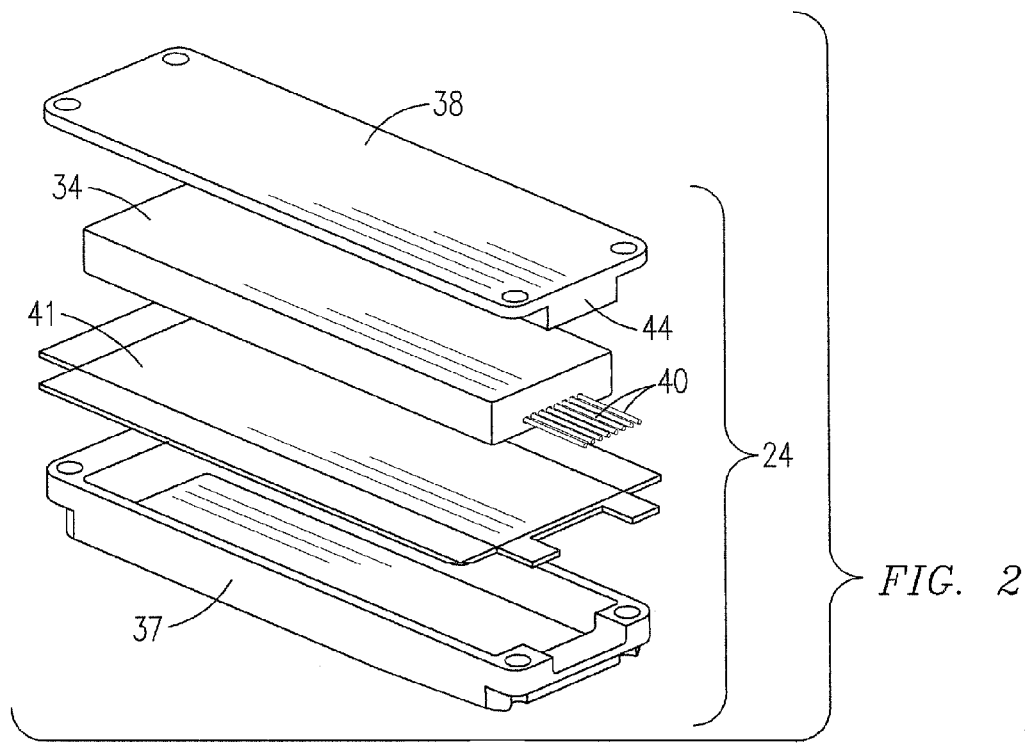
FIG. 2 is an exploded perspective view showing elements of the transmitter assembly of FIG. 1.

FIG. 2 illustrates a high temperature electronics package 34 that may contain a high temperature circuit board and form part of telemetry transmitter assembly 24. The main body of electronics package 34 may be fabricated from alloys with low thermal expansion coefficient such as Kovar® brand alloy, an alloy of Fe—Ni—Co. The thermal expansion coefficient of Kovar® alloy ranges from about $4.5$-$6.5 \times 10^{-6}/°$ C., depending on exact composition. The Ni-based alloys typically used for high temperature turbine components, such as turbine blade 20 have thermal expansion coefficients in the range of about $15.9$-$16.4 \times 10^{-6}/°$ C. Electronics package 34 may be affixed securely in place while allowing for relative movement between electronics package 34 and turbine blade 20, as described below with respect to FIG. 2. This relative movement may result from their different thermal expansion rates, which occur over time during the high number of thermal cycles between ambient air temperature and the greater than 300° C. operating temperature typically experienced proximate blade root 22.

The telemetry transmitter assembly 24, as best shown in FIG. 2, may include a mounting bracket 37 and a lid or cover plate 38 with electronics package 34 positioned there between. A plurality of connecting pins 40 enable connection between an electronic circuit board contained within package 34, such as one having a wireless telemetry circuit fabricated thereon, and various external devices such as lead lines from sensors, induction coil assemblies or data transmission antennae. Mounting bracket 37, cover plate 38 and retention screws 39 connecting them together (shown in FIG. 1) may all be fabricated from the same material as is turbine blade 20. This ensures there is no difference in thermal expansion between turbine blade 20 and mounting bracket 37. Consequently, no stresses are generated in mounting bracket 37 or turbine blade 20 during thermal transients.

The thermal expansion coefficient of electronics package 34 may be different than that of mounting bracket 37. When the operating system within which these components reside is at a high temperature, electronics package 34, including any circuit board contained therein, that are formed of Kovar® alloy would expand less than mounting bracket 37, which may lead to damage caused by vibrational energy in the system. In order to secure electronics package 34 within mounting bracket 37 to accommodate the dimensional change differential between bracket 37 and electronics package 34, a layer of ceramic fiber woven fabric 41 may be placed between the electronic package 34 and the inside surface of mounting bracket 37. Fabric 41 may be fabricated from suitable ceramic fiber, including such fibers as silicon carbide, silicon nitride or aluminum oxide. For example, a quantity of Nextel™ aluminum oxide based fabric, manufactured by 3M, may be used for fabric 41.

With electronics package 34 and ceramic fiber woven fabric 41 assembled with mounting bracket 37 and cover plate 38 to form telemetry transmitter assembly 24, mounting bracket 37 may be attached to turbine blade 20 by a suitable means for attaching such as bolting, welding, brazing or via transient liquid phase bonding. FIG. 1 illustrates a recess or flat pocket 42 that may be milled or otherwise formed within turbine blade 20 proximate blade root 22 for receiving assembly 24.

Cover plate 38 may be formed with a flange 44 oriented perpendicular to the direction of G-forces, to add structural support to the cover plate, which counters the g-load forces occurring when rotating turbine blade 20 is operating at full speed. This relieves retention screws 39 from carrying the load applied to cover plate 38 via g-forces, and allows them to be made sufficiently small so that the telemetry transmitter assembly 24 fits in the relatively small recess 42 with no interference with any adjacent components. If retention screws 39 were required to carry the load applied by the G-forces, their required size would be too large to fit in the available space.

FIG. 1 shows that the rotating antenna assembly 26 may be affixed to the end face or neck of root 22. Assembly 26 may be an electronic assembly having thermal expansion coefficients different than those of the Ni-based alloys used for turbine hot gas path components such as turbine blade 20 including its root 22. One or more rotating antenna assemblies 26 may be protected from windage during rotation of turbine blade 20 at or near the speed of sound. In an embodiment, the windage protection material is transparent to RF radiation frequencies in order to enable transmission of power and data through the material. Embodiments of rotatable antenna assembly 26 may include a durable, protective, RF transparent cover 50 shown in FIG. 1, which is essentially a hollow fixture within which a data antenna and induction power components are contained. RF transparent cover 50 protects its contents from the physical effects of windage during operation of the combustion turbine. Certain ceramics are suitable for protecting RF transmission equipment from the elements at elevated temperatures. However, many ceramics and ceramic matrix composites are prone to chipping and cracking under the vibrational impact and G-loading that a rotating turbine blade 20 experiences during operation of the combustion turbine. The inventors of the present invention have determined that RF transparent cover 50 may be fabricated from an RF transparent, high toughness, structural ceramic material. Ceramic matrix composites may be used to fabricate cover 50 as well as material selected from a family of materials known as toughened ceramics. Materials such as silicon carbide, silicon nitride, zirconia and alumina are available with increased toughness due to doping with additional elements or designed microstructures resulting from specific processing approaches.

One such material that is RF transparent, easy to form, and relatively inexpensive is a material selected from a ceramic family generally referred to as zirconia-toughened alumina (ZTA). Ceramic material selected from this family of aluminum oxide materials is considerably higher in strength and toughness than conventional pure aluminum oxide materials. This results from the stress-induced transformation toughening achieved by incorporating fine zirconium oxide particles uniformly throughout the aluminum oxide. Typical zirconium oxide content is between 10% and 20%. As a result, ZTA offers increased component life and performance relative to conventional pure aluminum oxide materials.

The designed microstructure of ZTA is fracture-resistant when the ceramic is loaded in compression. However, if loaded sufficiently in tension, the ceramic will fail catastrophically, as with traditional ceramic materials. Consequently, RF transparent cover 50 is designed so that the tensile stresses in the ceramic material are minimized during operation of the combustion turbine. This is accomplished by designing and fabricating such that (1) all corners, edges and bends of the ZTA components are machined to eliminate sharp corners and edges, in order to reduce the stress concentration factor at these locations, and (2) the orientation and fit of the ZTA component in a rotating antennae mounting bracket 51 is such that during operation the G-forces applied to the ZTA box do not generate significant bending stresses in the attachment flanges. This is accomplished by orienting the flanges parallel with the G-loading direction, rather than perpendicular to the G-loading direction, so the ZTA flange is loaded in compression and not in bending.

Mounting bracket 51 may be designed so that all the G-loading experienced by rotating antenna assembly 26 during operation of the combustion turbine is absorbed in a direction extending toward the upper end of the bracket 51. No portion of the mounting bracket 51 extends far enough past an antenna contained therein to attenuate the RF transmission data signal. RF transparent cover 50 is secured in place so its internal stress field is primarily compressive and may be retained using threaded pins (not shown) through semicircular divots on its flanges.

Mounting bracket 51 may be attached to a face of the turbine blade 22 via conventional means such as welding, brazing, bonding, bolting or screwing. An embodiment of rotating antenna assembly 26 may be assembled by placing desired antennae into the hollow body of cover 50 containing the antennae with a ceramic potting material. The potted RF transparent cover 50 containing the antennae may then be slid into mounting bracket 51, which may have been previously affixed to turbine blade root 22. Cover 50 may be secured to the mounting bracket 51 via pins inserted in the mounting bracket 51 and divots in the cover 50.

Figure 3:
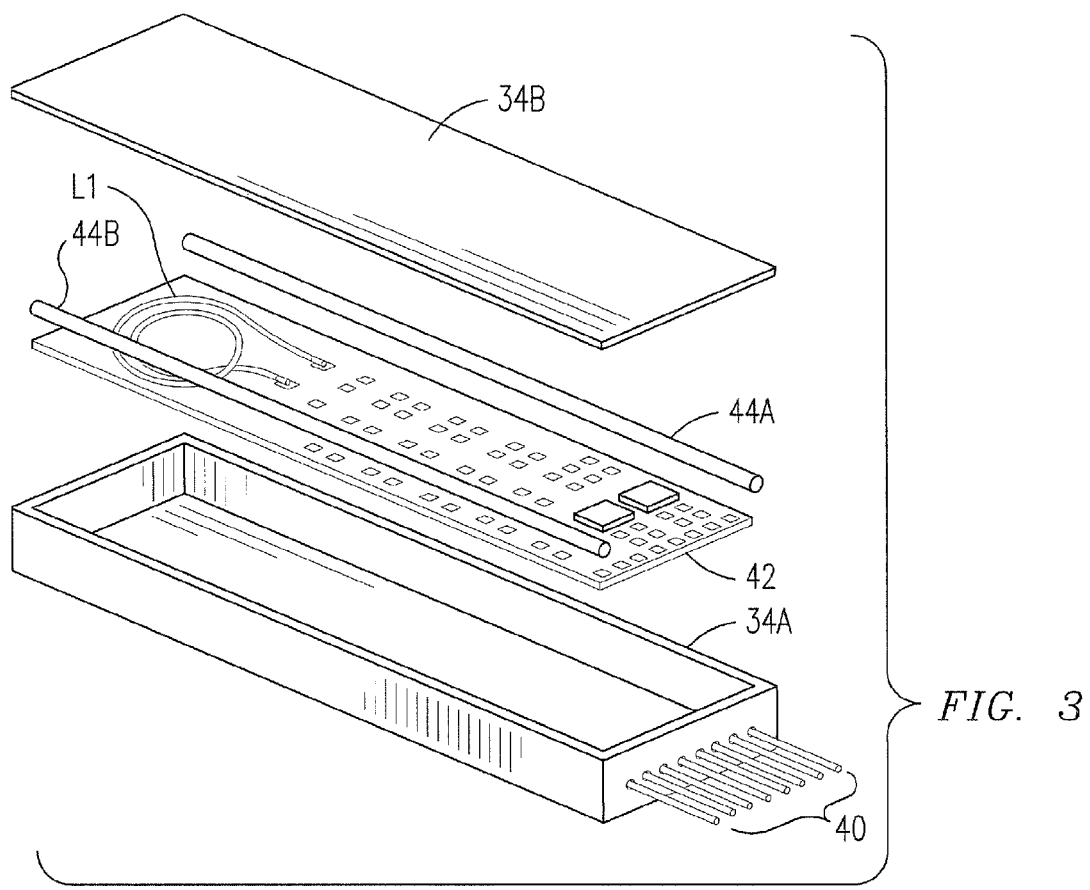
FIG. 3 is an exploded view showing the elements within the high temperature electronics package included in the transmitter assembly housing of FIG. 2.

Referring now to FIG. 3 an exploded view showing the elements within the high temperature electronics package 34 included within the housing 24 of FIG. 2, is shown. Package bottom cavity 34A includes electrical connecting pins 40 extending from an end thereof, which connectors enable communication between the electronics inside the package 34 and external sensors, sources and antennae. In order to function at high temperatures up to at least 450° C., the package must be designed and sized to contain the electronic circuit and its substrate, hereinafter PC board 42. The package must be able to withstand the temperature and centrifugal loading requirements and protect the circuitry on the substrate. Hence, the package 34 is made of gold-plated Kovar® alloy and the electrical connecting pins 40 are made of gold. The gold plating on the package 34 prevents oxidation of the Kovar® alloy, which can occur at elevated temperatures. The connectors 40 are insulated from the package by means of individual insulating sleeves (not shown). A pair of the pins 40 is coupled to electrical connectors 28, which communicate with the sensor 30. A third pin is coupled to ground potential (electrical ground), while pins 4, 5, 6 and 7 are coupled to a source of power (two each for positive and negative ac). The last pin is used for coupling the transmitter output (data) signal to the antenna 26.

PC Boards

The PC board 42 or substrate is preferably fabricated from material capable of operation at high temperatures, e.g., ceramic materials, such as alumina, zirconia, silicon carbide, silicon nitride, aluminum nitride, etc. The circuit runs (or "printed circuits") are preferably fabricated from metals that work at high temperature, such as silver, gold, platinum or palladium. The inventors chose a thick film process using alumina substrates for fabricating one embodiment of the PC board 42. The alumina substrates are metalized with a thick film gold paste. These substrates performed very well at high temperatures and were very compatible with the die attach process (discussed below). Dupont QG150 brand gold paste was chosen as the metallization. This paste comprises a high-density gold powder with a glass oxide binder. The PC board may be formed of alumina of 10-100 mils thickness. The final substrates comprise 96% alumina substrates measuring 20 mils thick. High density gold paste was used as the conductive layer, and also served as a surface capable of being soldered and wire bonded thereto. Printing capabilities allowed a line resolution of 5 mils.

The PC board 42 is assembled by the following process as outlined hereinabove. The substrates are prepared utilizing a thick film screen printing process. A specialized screen printer is used in conjunction with a patterned stainless steel fine mesh screen. The gold paste is printed onto an alumina ($Al_2O_3$) substrate. After printing, the paste is dried in an oven at 100° C. to "bake out" the solvents in the paste. Next, the substrates are placed in a furnace and fired at 850° C. During this process, the glass/oxide binders in the paste form a strong bond between the sintered paste and the alumina substrate. Multiple prints require multiple firing steps. In accordance with one embodiment, two printing/firing cycles (top and bottom side metallization) are employed.

Fired substrates are then cut out to the proper dimensions with a dicing saw. The top print has the circuit pattern formed thereon, while the bottom print is a metal plane that has been "meshed" due to printability limitations. The back metal plane will allow metallurgical bonding processes to be performed thereon.

Once the PC board 42 is completed and components attached thereto (described hereinafter), the PC board is then placed into the cavity 34A and a 12-carat gold wire 44A, 44B is laser welded to the cavity for forming a retainer to secure the PC board in place via compression. Holding the substrate into the package mechanically is of utmost importance because of the high g-forces exerted on the package and its contents. The retainer may be formed of a material having a coefficient of thermal expansion within 20% of that of the package in order to minimize differential thermal growth there between. It is feasible to add a filler material into the package 34 and to spread it over the PC board and the circuit components to help stabilize their placement during operation. However, any filler used must allow for any expansion or contraction of the components and their connecting wires during temperature cycles. Finally, a lid 34B is secured to the top of the cavity 34A. In accordance with one embodiment, Kapton® brand polyimide insulating tape was used to hold the lid 34B in place until it could be mechanically secured by compression. Another embodiment for securing the lid 34B is to weld it to the package cavity 34A.

As will be described in greater detail below, two different circuit layout patterns for the PC boards 42 may be used. A first pattern is designed for a circuit that senses changes of temperature of a selected component of the turbine, wherein the sensor 30 is a thermocouple. The signal indicative of the component temperature is amplified and processed by the circuitry, then transmitted via an FM transmitter and broadcast via an antenna such as the antenna 26. This type of circuit may be used for sensors other than those measuring temperature, but that also produce a direct-current (D/C) output signal as a response, such as static strain, conductive trace, chemical sensors or pressure sensors. A second pattern is designed for a circuit that senses dynamic strain occurring on a selected component of the turbine, wherein the sensor 30 is a strain gauge. The signal indicative of the dynamic strain occurring on the selected component is amplified and processed by the circuitry, then transmitted via a separate FM transmitter and broadcast via an antenna such as antenna 26. This type of circuit may be used for sensors other than those measuring dynamic strain, but that also produce an alternating-current (A/C) output signal as a response, such as accelerometers or electromagnetic wave emission detectors. An alternate embodiment uses a single FM transmitter that multiplexes multiple signals for transmission to a single FM receiver configured to decode the received signal into the two separate data signals. The PC board 42, as shown in FIG. 3, is partially complete in the illustration and is generally representative of the thermocouple circuit. Both circuits include an air core inductor coil L1, which is part of the tank circuit for the Colpitts oscillator of the FM transmitter, which will be explained further herein below. The quality factor Q of the coil L1 may be at least 5 at the operating temperature and operating frequency of the circuit. Sputtered gold or silver material may be used to form the coil; however, such deposition processes typically result in an inductor with a low Q value. The present inventors have successfully utilized gold or silver wire to form the inductor coil. The metal wire air core conductor may be potted along its length to prevent electrical shorts at high frequencies. Insulating tape may be wrapped on the potted wire where it crosses itself so as to prevent electrical shorts. Alternatively, the metal wire may be formed into a bridge at cross over points thereof in order to prevent electrical shorts. In order to increase the mechanical strength and stability of such a coil, a potting material may be placed around the wire, although any such potting material will necessarily affect the Q factor of the coil. In one embodiment, gold wire potted with a ceramic alumina paste suspension (such as Ceramabond® brand ceramic cement) provided a desired degree of structural stability at gas turbine operating temperatures and G forces and provided a Q factor of greater than 5. Such an alumina-based potting also acts as an electrical insulator for the coil, so no separate electrical insulation is required around the wire itself.

Die/Component Attachment

In order for the electronic package to function at elevated temperatures up to at least 450° C. and to withstand centrifugal loading greater than 1000 g's, special requirements are to be met for attaching components to the PC board 42. All bonds are performed in a vacuum oven for assurance of proper reflow of the solder. The inventors have appreciated a major problem that may be encountered when the component being soldered has a trivial mass. If the mass of the component is very small, it may be unable to break the surface tension of the liquid alloy as it beads up, and the component part may be pushed off the solder and slide to another position, or it may tilt at an angle (called "tomb stoning").

Figure 4A:
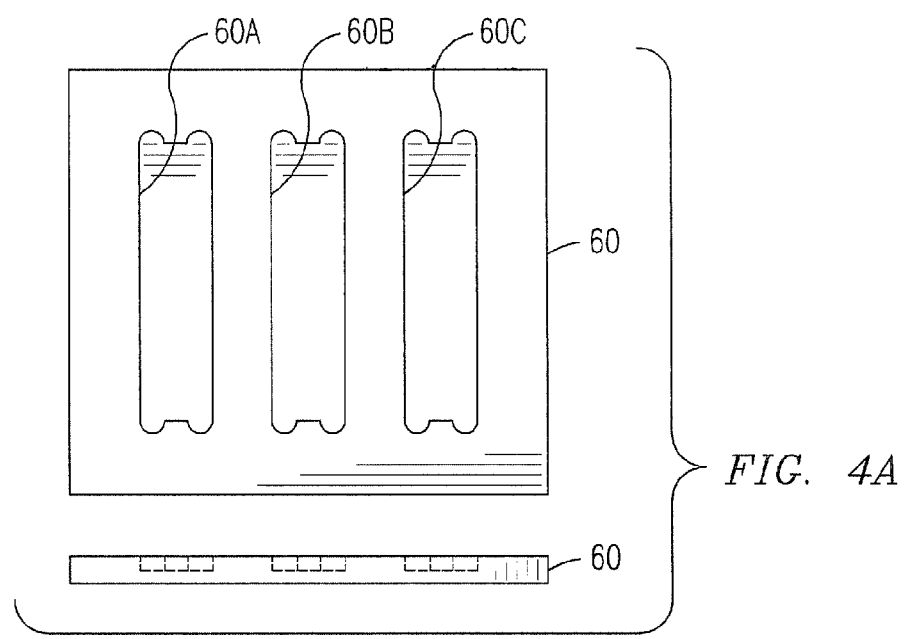
FIG. 4A illustrates plan and side views of a transfer plate for securing the circuit boards during the assembly operation.
Figure 4B:
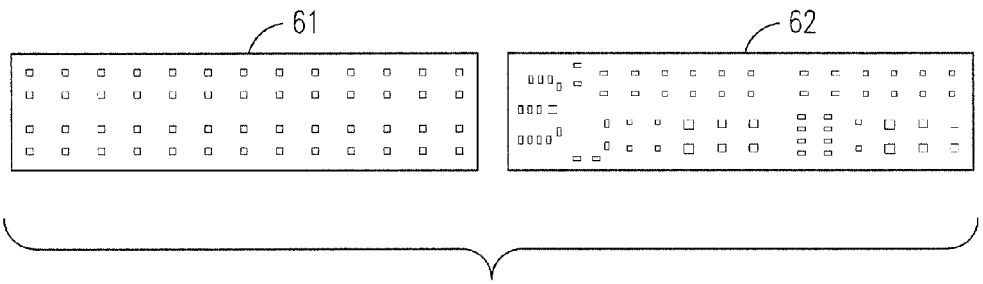
FIG. 4B is a plan view of the alignment plates to be used with the transfer plate of FIG. 4A for securing components in place during the assembly operation.

To overcome this problem, the present inventors have developed an approach utilizing a transfer plate and component alignment templates that fit in the heated fixture of the vacuum oven. A transfer plate 60 is shown in plan and elevation views in FIG. 4A and a pair of component alignment plates 61 and 62 are shown in FIG. 4B, also in plan view. FIG. 4A illustrates plan and end views of the transfer plate 60 used in assembling the PC board 42 shown in FIG. 3. The plate is made of graphite and is sized and shaped for receipt of the substrate (PC board) and the alignment plates 60, 61 for aligning the components to be attached to the PC board during the assembly operation. The alignment plates 60, 61 must be capable of withstanding high-temperatures, must be inert and resistant to solder, and must be capable of defining highly precise cutouts for the components. Accordingly, alloy 316 stainless steel may be used to fabricate these plates. Due to the small size of the cutouts and the need for high precision, laser cutting may be used for fabrication.

The next concern is the formulation of the solder for attaching the components to the PC board 42. The material must be compatible with the die metallization (Au thin film) and the substrate metallization (Au thick film).

Brazing, which is a relatively straightforward process involving the melting of a high temperature filler metal in between two wetting surfaces, was found to be less than optimal for the present application due to three primary factors: (1) most brazes have a liquidus temperature over 700° C. and require highly corrosive fluxes; (2) many brazing alloys are not eutectic and have a very large plastic region which may complicate processing; and, (3) most brazes are not compatible with gold surfaces.

The inventors also found Transient Liquid Phase (TLP) bonding to be less than optimal. In this process, a low melting point alloy is liquefied between two compatible surfaces. As the alloy fills in the gaps between the faying surfaces, it acts to "dissolve" or "leach" away compatible metals. This action changes the composition of the alloy, thereby shifting the melting point of the filler, resulting in solidification and an extremely high quality bond. The primary requirement of this process is that the surfaces being bonded to are thick while the molten alloy layer is extremely thin. When this process was applied to plated thin film (20 microns thick) and thick film (25 microns thick) substrates, the inventors found a very large inconsistency in the results with many not passing acceptance requirements.

The inventors have discovered that a solid state diffusion process utilizing pure gold is useful for the present application. In this process, no liquid metal is utilized. Instead, the rapid self diffusion property of gold is used to create a very high quality bond between two pure gold surfaces. While solid state diffusion may be performed with no filler material, it typically requires very high pressures to compress the facing surfaces together to obtain suitable contact area. In lieu of such pressure, the inventors selected a gold filler material to fill in the gaps between the bonding surfaces. Both gold foil and powder were investigated, with powder proving to be the better option, due to its ability to both fill in the gaps and to form a solid, homogeneous layer under heating due to sintering. Sintering is a process utilizing diffusion to join two small particles together into a solid matrix. This is generally performed at elevated temperature to increase the rate of diffusion. While the solid state diffusion process may be performed with a gold powder, it was further discovered that a gold paste was easier to use in this application. A paste may be applied by a number of methods, including dispensing, stamping, and screen printing. The major difference between a gold paste and a gold powder is that the paste has both an organic vehicle (such as polymers, terpineol, or glycol ethers) which acts as a transfer medium so that the powder may be easily applied, and surfactants that act to separate the powders until bonding is desired.

A number of gold thick film pastes were selected for use. While the paste has other additives (oxide based binders and glass frits) which will provide no adhesion to a pure gold layer, they are compatible with alumina substrates and thick film gold metallization. Additionally, these pastes are readily available, contain small high purity gold powder, and are designed for easy application. While many gold pastes have proved compatible, the best performing option was found to be DuPont QG 150, which is the paste with the highest gold composition available. This is the same paste used to metalize the substrate, and thus is very compatible with the entire system. In this process, the die and components are placed upon the gold metalized substrate with a small amount of the QG 150 gold paste. The assembly is then placed in an oven at 400° C. for 12 hours. During this time, the gold-gold diffusion takes place between neighboring gold particles and between the particles and the bonding surfaces. The resulting bond is very strong and capable of withstanding temperatures well above 500° C. Additionally, the process is straightforward, fast, repeatable, and may be performed on very small components.

Figure 5A:
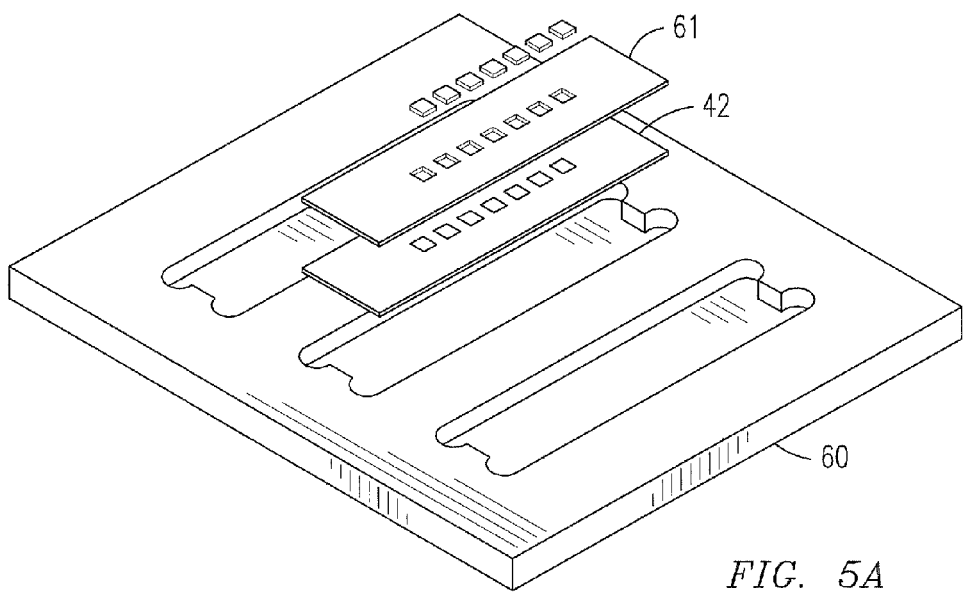
FIGS. 5A, 5B and 5C are perspective views of the assembly process using the transfer plate and alignment plate of FIGS. 4A and 4B.
Figure 5B:
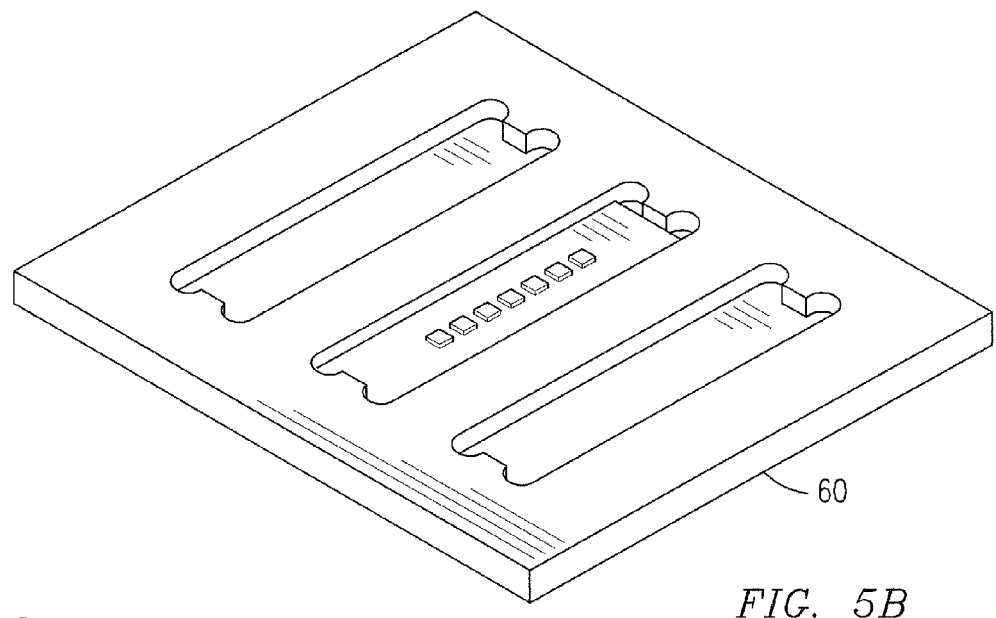
Figure 5C:
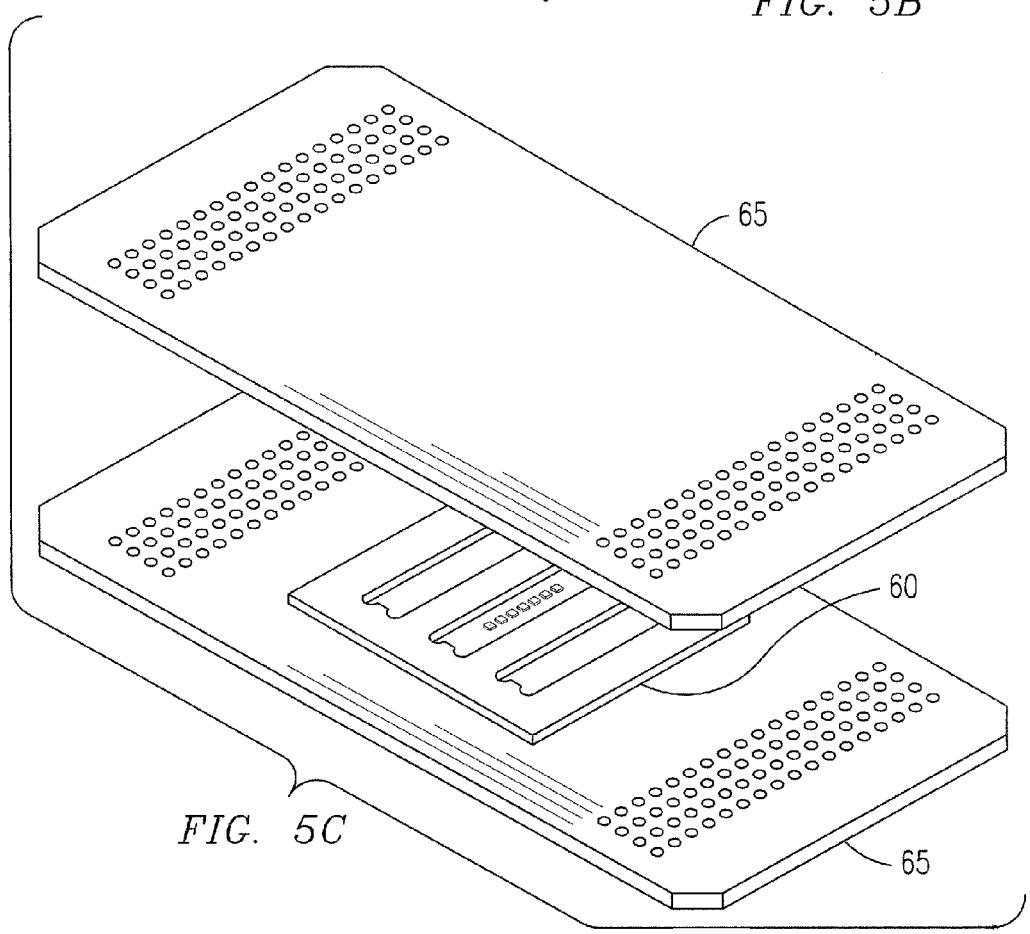

Referring now to FIGS. 5A, 5B and 5C, perspective views of the transfer plates used for aligning and assembling the components on the circuit board are shown. First, the substrates or PC boards 42 are placed in the cavities of the transfer plate 60. Next, the alignment plates 61, 62 are placed over the substrates. The component attachment gold paste is then placed in the openings of the alignment plates and the components are then placed in the openings of the alignment plates 60, 61 for the assembly operation. The transfer plate 60 along with the substrates, alignment plates, gold paste and components are sandwiched between heated graphite plates 65, as shown in FIG. 5C. The assembly is next placed in an oven at 400° C. for 12 hours. During this time, gold to gold diffusion takes place, and the die and components remain attached with a high shear strength at temperatures greater than 500° C. The process is made repeatable by a pick-and-place machine that properly aligns the die and components.

Wire Bonding

Figure 8:
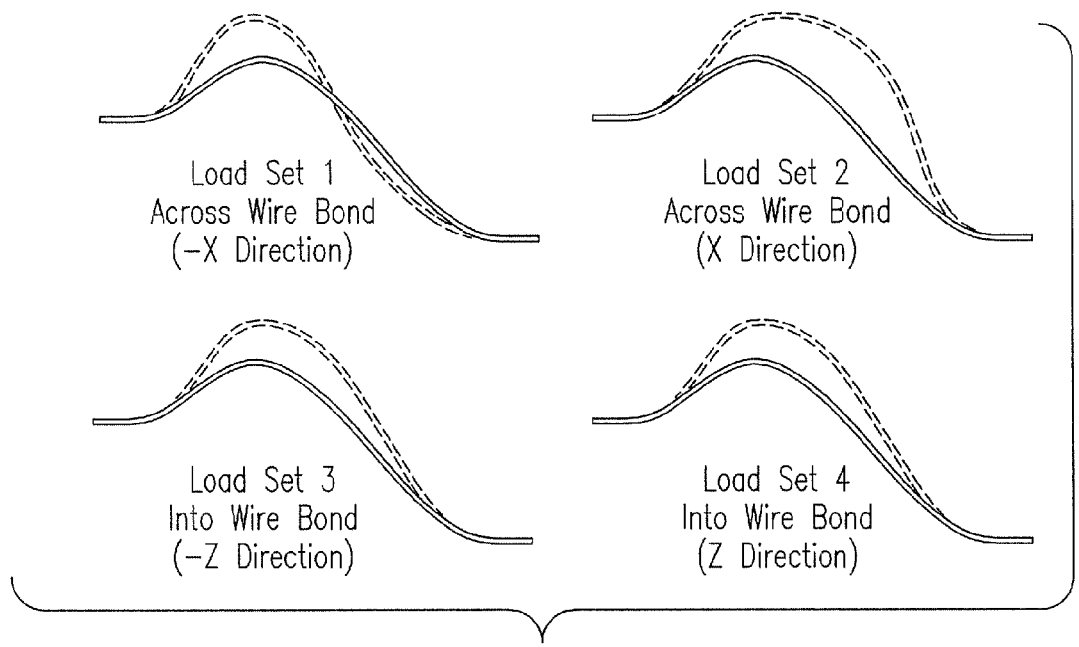
FIG. 8 illustrates various conditions of the wire bonding under simulated g-force stress.

Wire bonds are the standard method used in many electronic applications; however, they are not known by the inventors to be employed in an environment that subjects them to such high sheer forces (i.e., g-loading) while at high temperatures. Referring now to FIGS. 6A and 6B, wire bonding techniques typically used in the semiconductor arts are shown. FIG. 6A illustrates the foot and heel of each end of the bonding wire, and FIG. 6B illustrates the terms "loop height" and "bond length". FIG. 7 is a perspective view showing g-force analysis of a typical wire bonding, wherein the g forces are applied from four different directions. First, there are two possible forces in opposite directions across the wire bond (i.e. in directions parallel to the wire) that are labeled as the X and -X direction, and then there are two possible forces in opposite directions into the wire bond (i.e. in directions perpendicular to the wire) that are labeled as the Z and -Z direction. FIG. 8 illustrates diagrams of the wire bonding showing deformation of the wire under simulated g-force stress in these various directions. The interconnect technology used to connect integrated circuits to a PC board is a critical component to any electronic system.

Under high g-forces, it is normally expected that the wire bonds would deflect to a certain degree from their original position. The present inventors have unexpectedly discovered that it is possible to utilize gold wire bonds in the high temperature and high g environment of the present invention. It was found that loading of the wire bond in the X direction (Load Set 2 in FIG. 8) resulted in the least overall stresses in the wire. Gold wire bonds of both 0.7 and 1.0 mil diameter have been used. It has been shown that both diameters of wire bonds will be structurally stable if they are oriented parallel to the centrifugal loading, the maximum loop height is no greater than 17.4 mil, and the maximum bonding length (from bonding pad to bonding pad) is kept under 35 mil. These results are acceptable for loadings of greater than 1,000 g's, and in fact, were tested to be acceptable to loadings over 10,000 g's. The wire properties, loop height, bonding length and temperature all affect the maximum sustainable G-load of the wire bond.

Electronics

Figure 9A:
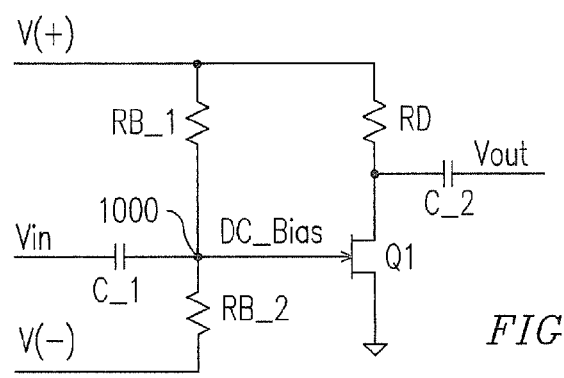
FIG. 9A is an exemplary schematic diagram illustrating the unique circuit biasing for amplifier circuits used herein.

Referring now to FIG. 9A, an exemplary schematic diagram is shown that illustrates the unique circuit biasing for amplifier circuits used herein. The function of the bias circuit is to place the JFET's into the proper area of operation. For a JFET, the places of operation can be various points within the ohmic region, where the JFET behaves as a small resistor, or within the saturation region, where the JFET behaves as a voltage controlled current source. Different biasing points lead to different JFET behavior; even different points within the same region. Many of the JFET's characteristics change when the JFET is operated over the temperature range of 25° C. to 500° C. Of specific interest herein is the fact that the device is going to exhibit less gain at high temperature than at low temperature. Another important change is the characteristics of the JFET performance over temperature, which is the downward (more negative) shift of the JFET threshold voltage over increasing temperature, which is demonstrated in the diagram of FIG. 9B.

Structurally, the amplifier circuit shown in FIG. 9A includes a voltage divider network comprising RB_1 and RB_2 serially coupled between a source of positive voltage V(+) and source of negative voltage V(−). A circuit node 1000 connecting RB_1 to RB_2 is coupled to one side of an input capacitor C_1 and to the gate terminal of a JFET Q1. The other side of C_1 is coupled to the input terminal V(in). The source terminal of the JFET Q1 is coupled to ground potential, and the drain terminal thereof is coupled to one side of a load resistor RD. The other side of the resistor RD is coupled to the source of positive voltage V(+). The drain terminal of Q1 is also coupled to the output terminal V(out) through another capacitor C_2.

Figure 9B:
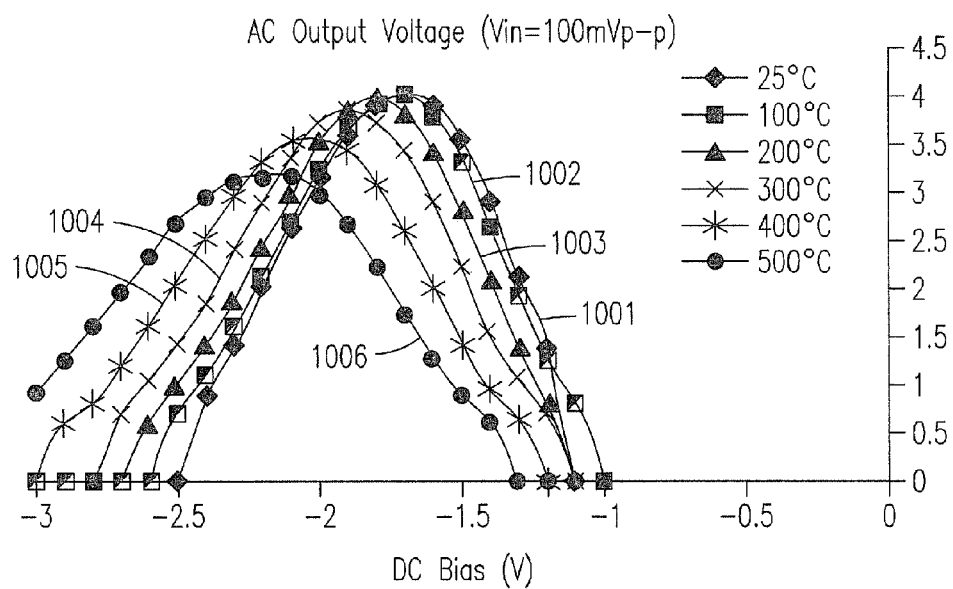
FIG. 9B is a chart illustrating the AC output voltage versus bias voltage of the amplifier of FIG. 9A under varying temperatures

FIG. 9B illustrates the changing level of AC output voltage versus bias voltage of the amplifier of FIG. 9A under varying temperatures. That is, the level of voltage on the node 1000 is plotted on the horizontal axis of FIG. 9B, and the resulting output voltage V(out) is plotted on the vertical axis. Curve 1001 represents the output voltage at a temperature of 25° C.; curve 1002 represents the output voltage at 100° C.; curve 1003 represents the output voltage at a temperature of 200° C.; curve 1004 represents the output voltage at a temperature of 300° C.; curve 1005 represents the output voltage at a temperature of 400° C.; and, curve 1006 represents the output voltage at a temperature of 500° C.

In a JFET common source ac amplifier (e.g., FIG. 9A), there is a narrow range of bias voltage that results in the highest ac voltage gain. Accordingly, as may be seen from this figure, there is a decreased gain over temperature that results in a lower maximum ac output voltage. Also, it is shown that the bias point where the maximum peak-to-peak output voltage occurs shifts to the left (more negative dc gate bias voltage with increased temperature). The ideal biasing circuit will track the peak thereby providing optimal performance. Hence, it is desirable to adapt the biasing dc voltage with temperature changes. The resistors RB_1 and RB_2 set the dc operating point of the gate to source voltage (Vgs) of the common source amplifier (FIG. 9A), which is the same voltage as that depicted on the horizontal axis of FIG. 9B. For example, the bias point for the peak ac voltage output at 25° C. is where Vgs=−1.7 v. The resistor RD is the JFET drain resistor, which helps determine the voltage gain of the amplifier. Two characteristics that must be accounted for when biasing the circuit over the temperature excursion (of 25° C. to 450° C.) are the bias point set by resistors RB_1 and RB_2, which should track the voltage results in the peak output voltage; and, the gain of the circuit should be increased with increasing temperature. If the above two measures are taken, the output characteristics of the device will remain essentially constant over the temperature range of interest. This can be accomplished by designing the resistor RB_1 to have a positive temperature coefficient (PTC) of resistance, while the resistor RB_2 has a zero temperature coefficient (ZTC) of resistance. A second approach is to give the resistor RD a PTC as well, so as to increase the amplifier gain as the temperature increases (resulting in a gain at high temperature equal to that at low temperature).

Temperature coefficients of resistance can be implemented in several ways. They can potentially be applied using surface mount thermistors or they can be fabricated with different materials affixed to the circuit board. There are many thick film pastes available that possess various temperature coefficient of resistance (TCR). In accordance with one embodiment, the resistors RB_1 and RD are formed of TaN Thick Film, while the resistor RB_2 is formed of Platinum Thick Film.

Figure 10:
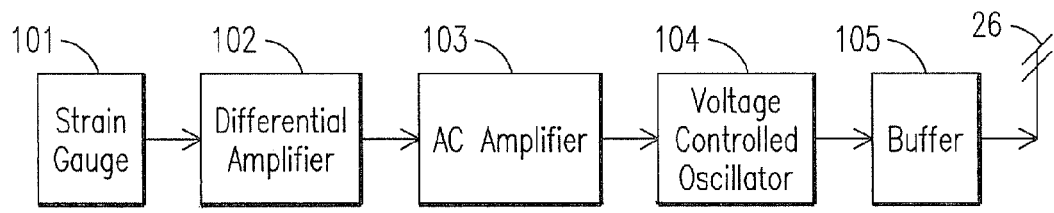
FIG. 10 is a block diagram of the strain gauge circuitry.

Referring now to FIG. 10, a block diagram of the strain gauge circuit is shown. A signal indicative of the amount of strain placed on a measured turbine component is produced by a strain gauge 101. This signal is then sensed by a differential amplifier 102 and coupled to an AC amplifier 103 for further amplification. The amplified strain gauge signal is then applied to the input of a voltage controlled oscillator 104, which produces an oscillatory signal the frequency of which is representative of the strain placed on the measured turbine component. This oscillatory signal is then buffered by a buffer 105 and passed on to the antenna 26 for transmission to a conventional tuner (not shown) tuned to the carrier frequency.

Figure 11:
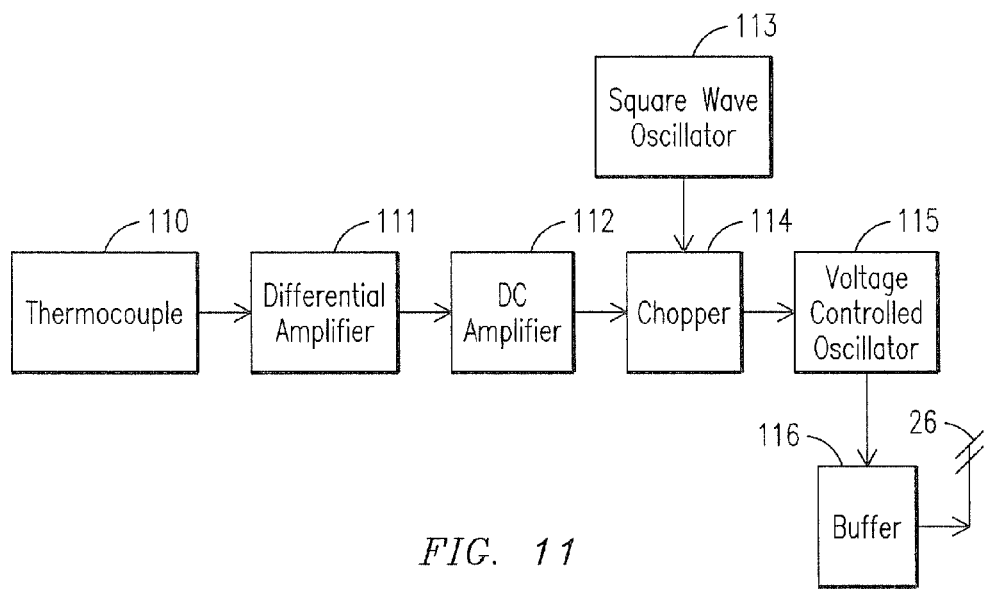
FIG. 11 is a block diagram of the thermocouple circuitry.

Referring now to FIG. 11, a block diagram of the thermocouple circuit is shown. A signal indicative of the temperature of a measured turbine component is detected by a thermocouple 110, which signal is passed on to a differential amplifier 111. The output of the differential amplifier 111 is passed on to a dc amplifier 112. The output of the amplifier 112 and the output of a square wave oscillator 113 (or square wave generator) are coupled to inputs of a "chopper" 114. The output of the chopper 114 is coupled to the input of a voltage controlled oscillator 115, which produces an oscillatory signal the frequency and amplitude of which is representative of the temperature sensed on the measured turbine component. This oscillatory signal is then buffered by a buffer 116 and passed on to the antenna 26 for transmission to a conventional tuner (not shown) tuned to the carrier frequency. Where both types of circuits are used on the same turbine, the carrier frequencies would be different in order to avoid confusion between the two signals.

Figure 12:
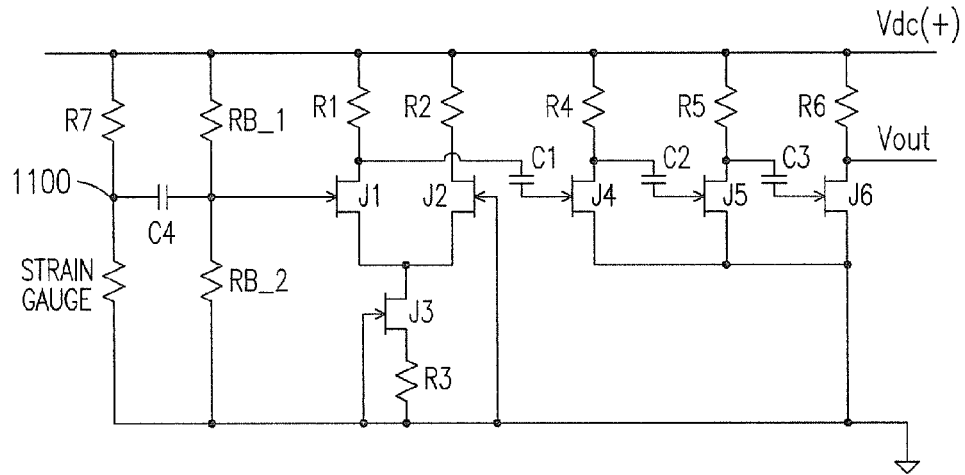
FIG. 12 is a schematic diagram of the circuit for amplifying a strain gauge output signal.

Referring now to FIG. 12, a schematic diagram of the circuits 101, 102, and 103 for amplifying a strain gauge output signal is shown. Modification of the traditional wireless telemetry circuit design was required in order to accomplish the required tasks electrically with a more limited selection of available electrical devices usable at temperatures in excess of 450° C. A strain Gauge signal conditioning (excitation and amplification) circuit was designed using only one type of transistor, a JFET with high temperature metallization. The connection of the metal bonding pads (i.e., gold) cannot be made directly to the semiconductor material, but must utilize an adhesion layer, such as Tungsten, and perhaps adding a diffusion barrier as well. These metals comprise the "metal stack" of the die, i.e., high temperature metallization.

Structurally, there is a voltage divider network comprising resistor R7 and a Strain Gauge coupled between a source of positive voltage Vdc(+) and ground potential. Circuit node 1100 is the connection point between resistor R7 and the Strain Gauge, and is also coupled through a capacitor C4 to the gate terminal of a JFET transistor J1. The transistor J1 is biased by a pair of resistors RB_1 and RB_2, which are joined at the gate terminal of this transistor, in the same manner as described above with reference to FIG. 9A. Transistor J1 is half of a differential amplifier that includes transistor J2. The drain terminal of the transistor J1 is coupled to the positive voltage Vdc(+) through a resistor R1 and the drain terminal of the transistor J2 is coupled to the same Vdc(+) through a resistor R2. The source terminals of the transistors J1 and J2 are coupled together and to the drain terminal of another transistor J3, which includes a gate terminal coupled to ground potential and the source terminal thereof coupled also to ground potential through another resistor R3. The gate terminal of the transistor J2 is also coupled to ground potential. Therefore, any change on the gate terminal of the transistor J1 will be amplified at the drain terminal thereof and coupled through a capacitor C1 to the gate terminal of yet another transistor J4, which is the first of three more stages of amplification (ac amplifier 103) including transistors J5 and J6, with the output of the amplifier provided at a terminal Vout.

A change in the strain placed on the component being measured, which component includes the Strain Gauge, changes the resistance of the Strain Gauge resistor, thereby changing the voltage at the gate terminal of the transistor J1. This changes the output of the transistor J1 across a resistor R1, which is coupled to succeeding stages of amplification by the transistors J4, J5 and J6. All of the resistors shown in FIG. 13, with the exception of the resistor RB_1 (which has a PTC), have a very low (close to zero, slightly positive) temperature coefficient of resistance. Also, all of the JFET transistors are made with high temperature metallization, as described hereinabove.

Figure 16:
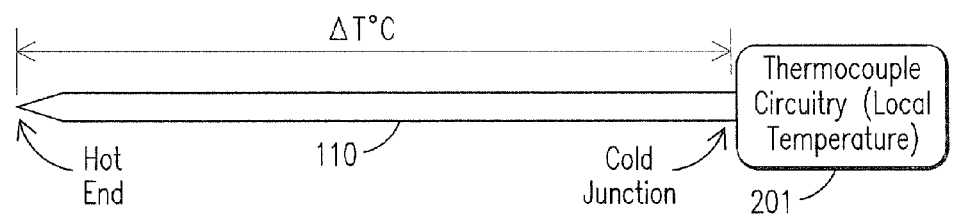
FIG. 16 is a diagram of a representative thermocouple.
Figure 13:
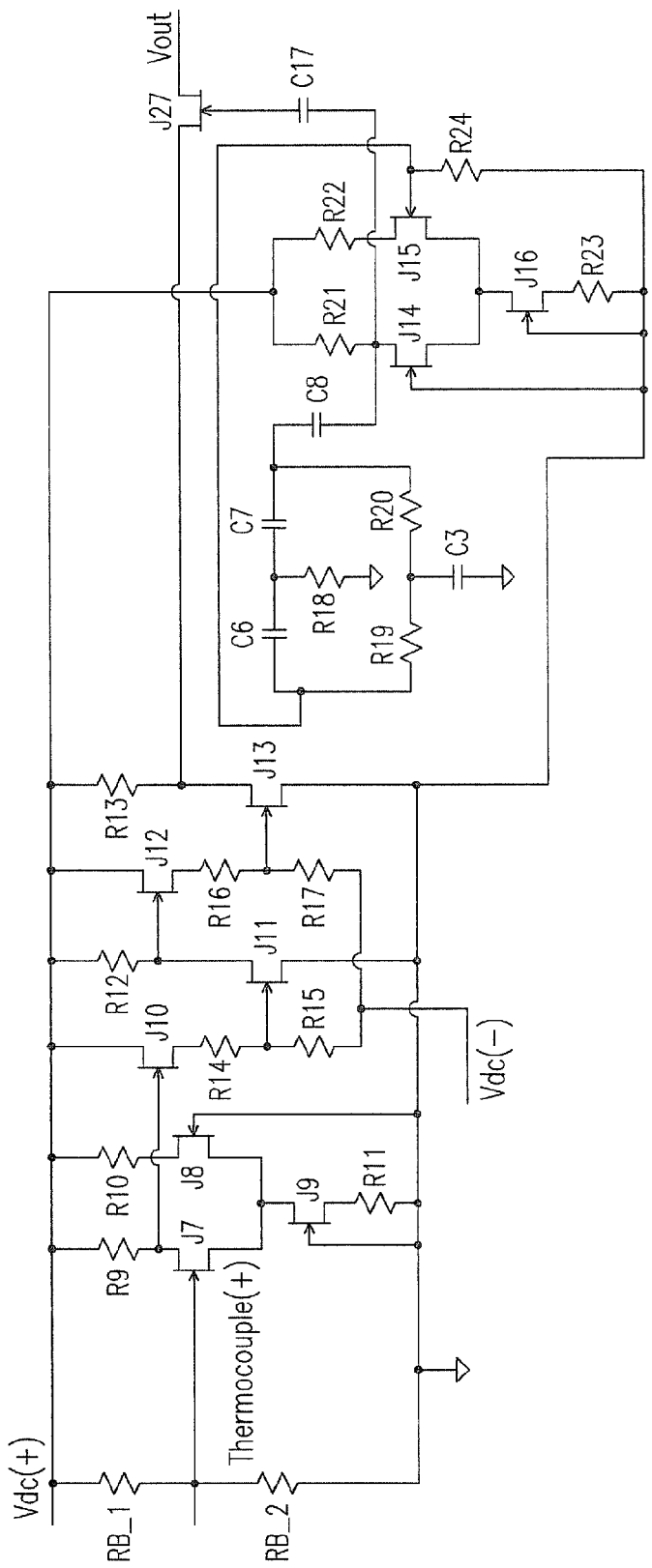
FIG. 13 is a schematic diagram of the circuit for amplifying a thermocouple output and embedding the local temperature of the transmitter into the amplified output signal.

Referring now to FIG. 13, a schematic diagram of the circuits 110, 111 and 112 for amplifying a thermocouple output and embedding the local temperature of the thermocouple circuitry into the amplified output signal is shown. In this manner, the thermal gradient across the thermocouple, rather than just the thermocouple output, can be transmitted, thus giving an accurate temperature measurement. FIG. 16 illustrates the thermocouple 110 coupled to the circuitry shown in the block diagram of FIG. 11 (i.e., the thermocouple circuitry 201). The thermocouple 110 output is shown as representing $\Delta T° C$. As will be shown and described further hereinafter it is the sum of $\Delta T° C$. and the local temperature of the thermocouple circuitry 201 that represents the true measured temperature of the turbine.

Referring again to FIG. 13, the negative leg of the thermocouple is grounded, and the positive leg is connected to the gate terminal of a transistor J7, which along with transistor J8, forms the differential amplifier 111. This differential amplifier is biased by the voltage divider comprising RB_1 and RB_2 coupled together at the gate terminal of transistor J7 plus a current source formed with a transistor J9. As described hereinabove, the resistors RB_1 has a PTC and the resistor RB_2 has a ZTC in order to compensate for the high temperature environment (see FIG. 9A and accompanying description).

Since the thermocouple signal is dc, or very low frequency ac, successive amplification stages cannot be capacitively coupled. Instead, a transistor J10 is used in the source follower configuration to shift the output of the differential amplifier down to the level at which the common source transistor J11 must be biased. It will be appreciated that the source follower lowers the output impedance of the differential amplifier. The transistor J11 serves to further amplify the signal. Transistors J12 and J14 form another level shifting and amplification stage (dc amplifier 112). At this point, the output of the thermocouple has been amplified to an appropriate level. Now the local temperature of the thermocouple circuitry must be embedded into the amplified signal.

Figure 18:
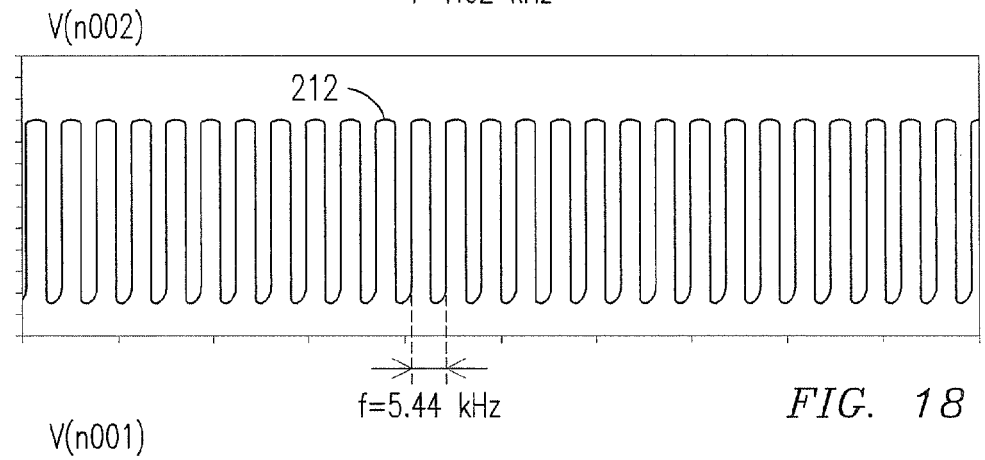
FIG. 18 is a waveform diagram illustrating the output of the square wave generator for the thermocouple circuitry at elevated temperature.
Figure 19:
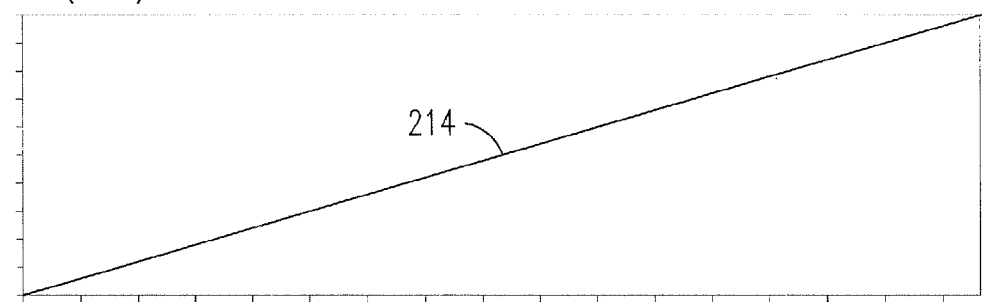
FIG. 19 is a waveform diagram illustrating the output voltage of the thermocouple as temperature is increased.
Figure 20:
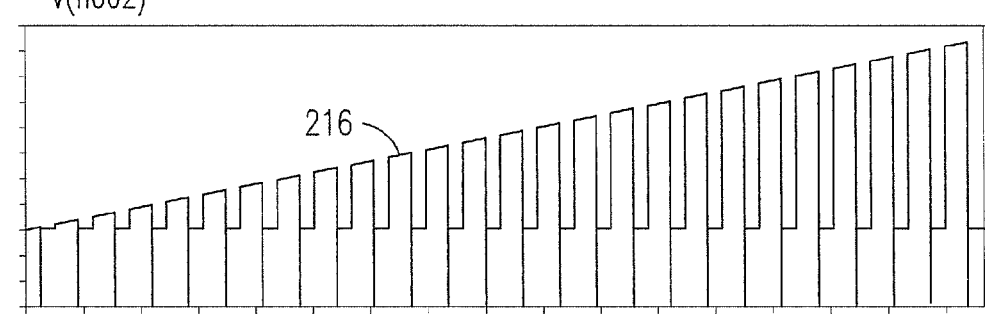
FIG. 20 is a waveform diagram illustrating the output of the chopper, which is the combined output of the thermocouple and the square wave generator.

Transistors J14 and J15 form a differential pair amplifier, biased by a current source formed by a transistor J16. Capacitors C6 and C7, along with resistors R18, R19 and R20 form a −90° to +90° phase shift network. This phase shift network is connected at one end of the amplifier input at the transistor J15, and the other end is coupled to the output of the amplifier (the drain terminal of the transistor J14), which comprises an RC feedback network. This configuration forms a relaxation type RC oscillator (square wave oscillator 113). Capacitors C6 and C7 are NP0 type capacitors, and their capacitance does not change appreciably over the temperature excursion of 25° C. to 450° C. An NP0 capacitor dielectric has a negative-positive—zero temperature coefficient of capacitance, wherein the positive and negative temperature coefficients cancel one another out. Capacitor C8 is coupled in series between the RC feedback network and the output of the differential amplifier at the drain terminal of transistor J14. This capacitor is made with an X7R dielectric, and thus its capacitance changes predictably with temperature changes. X7R is a capacitor dielectric that has a higher dielectric constant than does the NP0 dielectric, but has a large capacitance dependence on temperature (which is predictable). The output of this oscillator is a square wave with a frequency determined by the temperature dependent capacitor C8; thus, the local temperature of the thermocouple circuitry may be encoded into the square wave signal. (See the oscillator 113 output waveform 210 shown in FIG. 17 at room temperature; and the same oscillator output waveform 212 at an elevated temperature, shown in FIG. 18). A transistor J27 serves as a chopper transistor (i.e., chopper 114). The amplified thermocouple output from the transistor J13 (waveform 214 in FIG. 19) is coupled to the drain terminal of the transistor J27, while the square wave oscillator output is coupled to the gate terminal of the same transistor J27. The source of the transistor J27 provides a square wave output, whose amplitude is proportional to the temperature of the thermocouple 110 and whose frequency is proportional to the temperature of the thermocouple circuitry (see waveform 216 shown in FIG. 20). Thus, the signal contains the thermocouple output plus the temperature of the thermocouple circuitry, which signal is applied to the voltage controlled oscillator 115.

Figure 17:
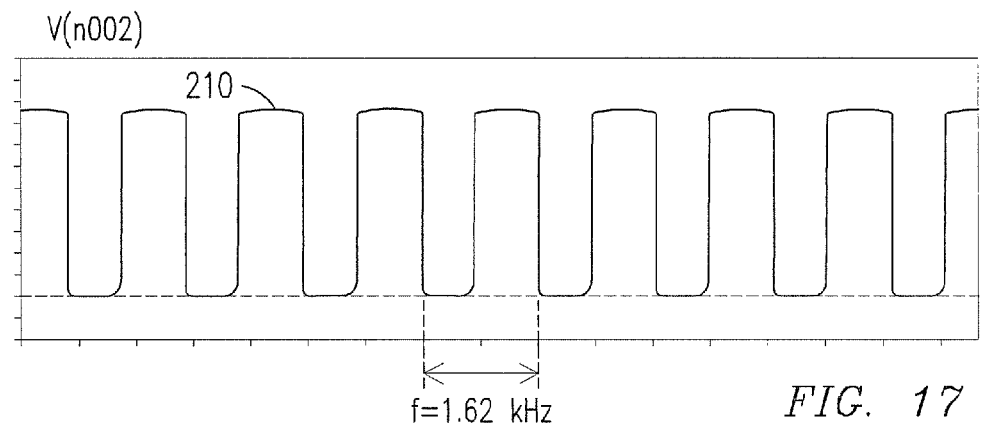
FIG. 17 is a waveform diagram illustrating the output of the square wave generator for the thermocouple circuitry at room temperature.

By way of example of operation of the thermocouple 110 and its circuitry 113, assume that the temperature of the circuitry 113 is at 25° C. and the corresponding output of the oscillator 113 is at a frequency of 1.62 kHz (waveform 210, FIG. 17). Also, assume for the particular thermocouple 110 being used that a 12 mv output voltage (waveform 214, FIG. 19) corresponds to a ΔT of 320° C. Now, assume that the temperature of the circuitry 113 is 325° C. and the output of the oscillator 113 is 5.44 kHz (waveform 212, FIG. 18). By combining the waveforms 212 and 214 with the transistor J27, the resultant output of the transistor J27 (i.e., output of the circuit) is illustrated by the waveform 216. Thus, the resulting temperature measured is 645° C. at the hot end of the thermocouple. The frequency of the waveform 216 represents the temperature of the local circuitry 113 and the amplitude represents ΔT. Accordingly, one skilled in the art can construct circuitry associated with the FM receiver (not shown) to perform signal decoding and addition operations.

Figure 14:
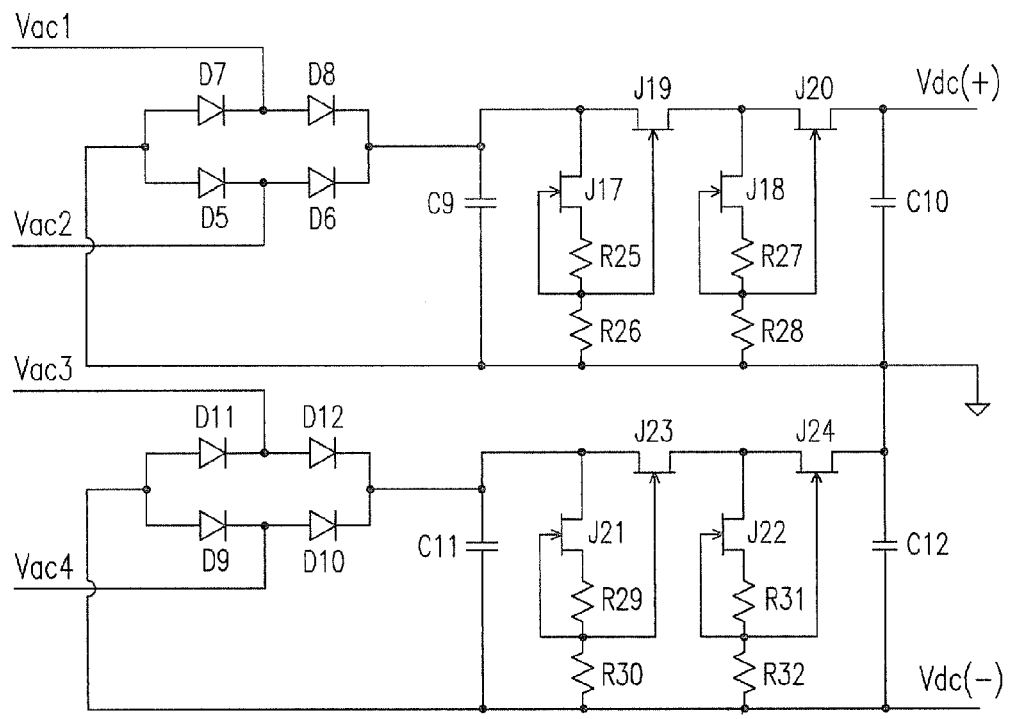
FIG. 14 is a schematic diagram of the power conditioning circuitry.

Referring now to FIG. 14, a schematic diagram of the power conditioning circuitry is shown. A power conditioning circuit capable of rectifying an RF input voltage, filtering and rectified voltage, and regulating that voltage had to be designed using only one type of transistor and available diodes. The circuit rectifies RF induction power provided by the rotating turbine and delivers a positive and negative regulated dc voltage. Structurally, diodes D5 through D8, as well as diodes D9 through D11, serve as a bridge rectifier. An ac voltage on terminals Vac1 and Vac2 or Vac3 or Vac4 is full-wave rectified into a dc voltage with a large ripple. Capacitors C9 through C12 serve as filter capacitors in order to reduce the ripple to a sufficiently low level. Transistors J17 and J21 serve as constant current sources, delivering a constant current into resistors R26 and R30, respectively. This constant current going through a constant resistance produces a constant voltage, which is coupled to transistors J19 and J23. This constant voltage biases transistors J19 and J23 such that, after a threshold determined by the R25/R26 resistor pair or R29/R30 resistor pair, any increasing voltage at the inputs to the transistors does not contribute to an increasing voltage at the transistor outputs. The increasing voltage input is dissipated as heat in the transistors J19 and J23. Thus, the transistors J17 and J19, as well as transistors J21 and J23 comprise low-dropout (LDO) voltage regulators. These regulators are repeated with the transistors J18 and J20, as well as the transistors J22 and J24 to improve the net voltage regulation. The voltages are then supplied as either positive or negative regulated voltages Vdc(+) or Vdc(−), respectively.

In accordance with one embodiment the resistors R26, R28, R30 and R32 have a PTC, whereas the resistors R25, R27, R29 and R31 have a ZTC. As discussed hereinabove, this arrangement of resistors compensates for changes in bias voltages at elevated temperatures. In this way the circuit self compensates for temperature variations and keeps the voltage drop across the transistors J19, J20, J23 and J24 constant. As described hereinabove, PTC resistors may be made of platinum and ZTC resistors may be made of tantalum nitride. It is pointed out that the circuit would also function the same where the resistors R26, R28, R30 and R32 were made with ZTC and the resistors R25, R27, R29 and R31 were made with a negative temperature coefficient (NTC) by the use of a silicon resistor, such as silicon carbide.

Figure 15:
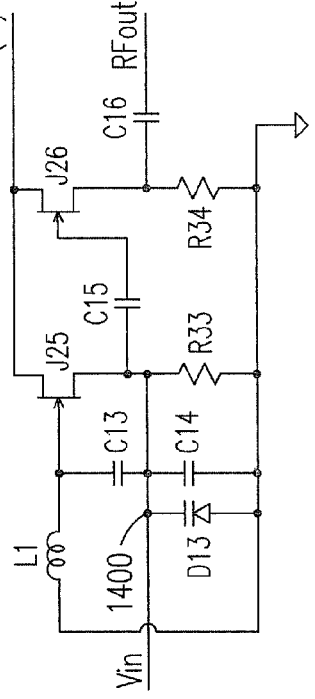
FIG. 15 is a schematic diagram of the FM transmitter including a Colpitts oscillator.

Referring now to FIG. 15, a schematic diagram of the FM transmitter (i.e., VCO 104 and Buffer 105) is shown. In order to create a frequency modulated (FM) signal, a variable impedance device is commonly used to encode (i.e., modulate) information onto an RF carrier wave. A common way to do this task in low-temperature circuitry is to use a device whose capacitance has a dependence on applied voltage. Almost all pn junction diodes exhibit this characteristic when reverse biased; that is, a varying voltage applied to a reversed biased diode affects change in the capacitance across the diode. For low-temperature radio applications, a special diode, called a varactor, is used for this purpose. The varactor is a pn junction diode, with a "hyper-abrupt" junction (i.e., a junction that is heavily doped to promote a large tuning angle) and is fabricated from silicon or gallium arsenide.

The circuit shown in FIG. 15 includes a Colplitts oscillator comprising an inductor L1 and serially coupled capacitors C13 and C14, both of which are coupled in parallel with the inductor L1. A transistor J25 serves as the active device in the Colplitts oscillator. The carrier frequency of the oscillator is determined by the value of the inductor L1 and the capacitors C13 and C14. A diode D13, which is coupled in parallel with the capacitor C14, serves as a voltage variable capacitor, or varactor, which modulates (i.e., encodes) an ac voltage onto the carrier wave. The carrier wave is then capacitively coupled into a transistor J26, which serves as both a buffer transistor as well as a power amplifier. The cathode of the diode D13 is coupled to a circuit node 1400 and the anode thereof is coupled to the ground potential. The circuit junction between the capacitors C13 and C14 is coupled to the node 1400, which also comprises the input terminal V(in) to the circuit. The output of the circuit is then capacitively coupled into the transmit antenna (not shown).

In high-temperature applications, typical varactors cannot be used and are not useful in the FM transmitter of interest herein because the capacitance of such varactors may not be consistently repeatable or predictable due to hysteresis effects non-linear over a range of applied bias voltages at elevated temperatures. Hence, correct information could not be recovered from the transmitted signal (identical frequency deviations would not correspond to distinct tuning voltages). It was discovered that the problem was intrinsic to SiC itself, and thus no SiC device would achieve the desired result. GaN devices, which can function at high temperatures (i.e., have a linear capacitance over the same range of applied bias voltages at the same elevated temperatures), were explored for use as the varactor diode D13. Gallium Nitride (i.e., GaN) is also a wide band gap semiconductor, with a wide band gap energy of 3.4 eV @300 K (whereas SiC is 2.86 eV), meaning that it can function at high temperature (in excess of 600° C.). The only commercially available GaN diode currently available is in the form of a blue or ultraviolet LED, which produced satisfactory results across the temperature excursion of interest herein.

The description below will provide details of circuitry embodying aspects of the present invention, which in one example application may be used in strain gauge circuitry, as exemplarily illustrated in FIG. 21. It will be appreciated that such example application should not be construed in a limiting sense being that circuitry embodying aspects of the present invention may be used in other applications.

Figure 21:
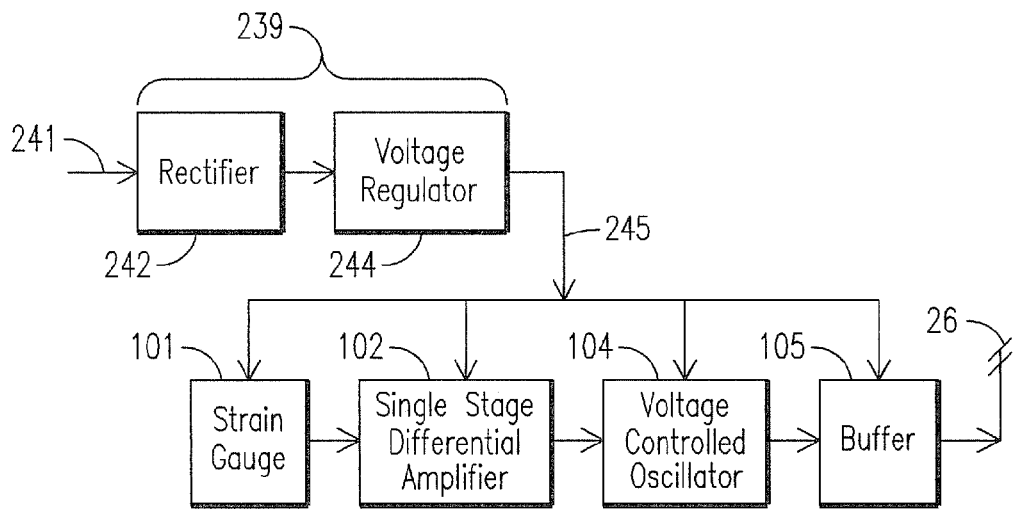
FIG. 21 is a block diagram of another example of strain gauge circuitry, which may be used by the telemetry system, and which may benefit from a high-gain differential amplifier and/or a voltage regulator embodying aspects of the present invention.
Figure 22:
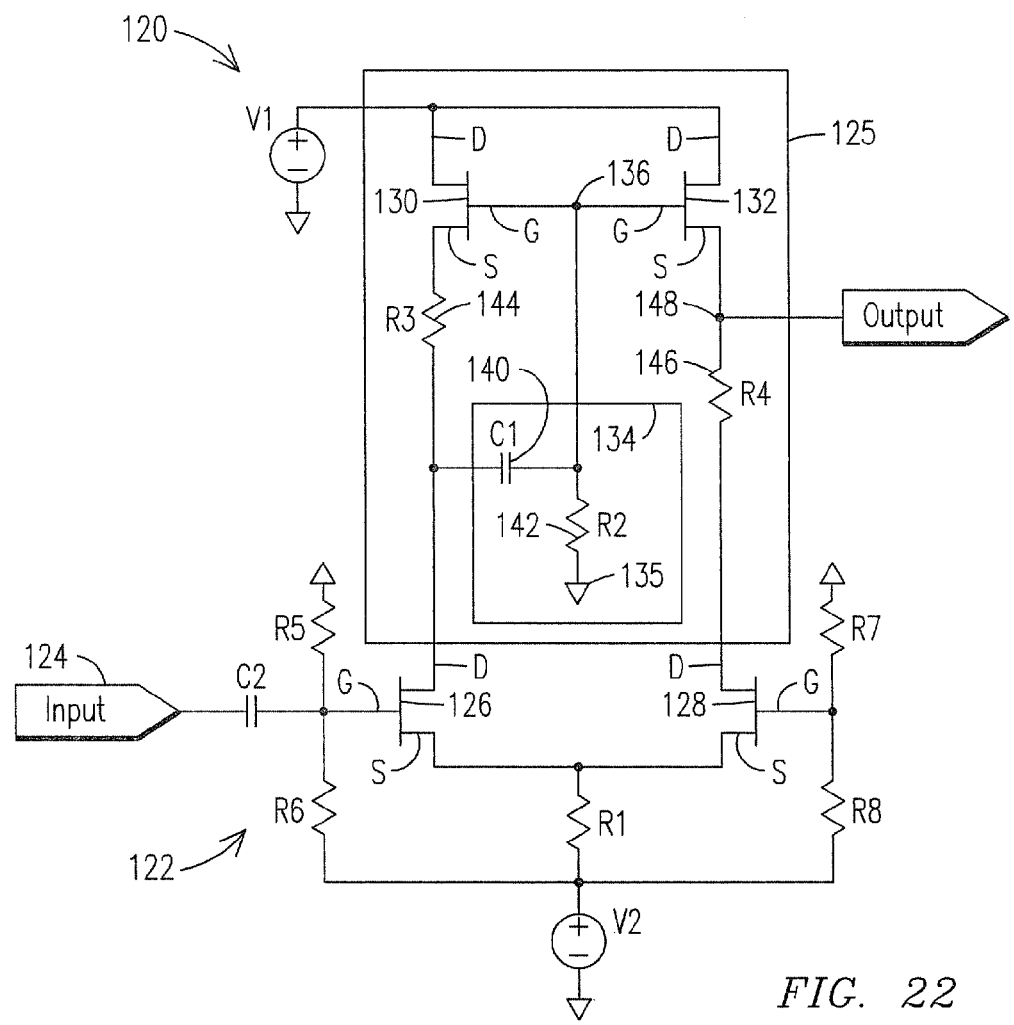
FIG. 22 is a schematic representation of one example embodiment of the high-gain differential amplifier, such as an AC-coupled hybrid-load differential amplifier.

FIG. 22 is a schematic representation of one example embodiment of circuitry 120 embodying aspects of the present invention. Circuitry 120 includes a differential amplifier 122 having an input terminal 124, which may be coupled to a sensing element (e.g., strain gauge 101 FIG. 21) to receive a voltage indicative of a sensed parameter (e.g., voltage indicative of strain). Differential amplifier 122 may include a first pair of semiconductor switches 126, 128 (e.g., differential pair of semiconductor switches). Biasing of the differential pair of semiconductor switches 126, 128 may be controlled by a respective bridge circuit (gate bias network) made up of resistors R5, R6, R7 and R8, which may optionally use the temperature-compensated biasing techniques described above in the context of FIGS. 9A and 9B. For example, as the temperature increases, a respective bias voltage at the respective gate terminals of the semiconductor switches 126, 128 decreases. Circuitry 120 further includes a hybrid load circuitry 125, which in accordance with example aspects of the present invention may be AC-coupled (alternating current-coupled) to differential amplifier 122, as elaborated in greater detail below.

Hybrid load circuitry 125 may include a second pair of semiconductor switches 130,132 (e.g., active-load pair of semiconductor switches). Each of such pairs of semiconductor switches has a respective drain terminal (D), a respective source terminal (S) and a respective gating terminal (G). In one example embodiment, the first pair of semiconductor switches 126, 128 and the second pair of semiconductor switches 130, 132 involve circuitry without complementary pairs of semiconductor switches. In one example embodiment, the first pair of semiconductor switches 126, 128 and the second pair of semiconductor switches 130,132 may be n-channel junction gate field-effect transistor (JFET) switches and may comprise a respective high-temperature, wide bandgap material, such as SiC, AlN, GaN, AlGaN, GaAs, GaP, InP, AlGaAs, AlGaP, AlInGaP, and GaAsAlN.

As will be appreciated by one skilled in the art, p-channel SiC JFETs are presently believed to be impractical due to their relatively low-channel mobility, and consequently, known active load topologies for differential amplifiers have not been utilized in high-temperature applications since such topologies would involve p-channel SiC JFETs. Hybrid load circuitry embodying aspects of the present invention, advantageously eliminates a need of p-channel JFETs, and thus such a circuitry can reach the theoretical temperature limits of high-temperature, wide bandgap material JFETs (e.g., above 500° C.) and effectively provide a high-gain differential amplifier, which, in one example application, may be utilized to appropriately amplify in a high-temperature environment the relatively low-voltage (e.g., a few millivolts) electrical signals, which may be generated by sensors, such as thermocouples and strain gauges.

In one example embodiment, hybrid load circuitry 125 may further comprise a resistor-capacitor circuit 134 (e.g., a resistor 142 and a capacitor 140) arranged to provide a path (e.g., relatively high-impedance path) to an AC signal component with respect to the drain terminal of the switch of the differential pair of semiconductor switches, which receives the voltage indicative of the sensed parameter (e.g., switch 126). Circuit 134 is connected to a node 136 coupled in parallel circuit to the respective gate terminals of the second pair of semiconductor switches 130,132. It will be appreciated that node 136, which is connected to an electrical ground 135 by way of resistor 142 is effective to maintain an appropriate biasing for semiconductor switches 130, 132.

In one example embodiment, the value of resistor 142 may be chosen to be sufficiently low relative to the value of the input impedance at the respective gate terminals of switches 130, 132 so that, for example, an AC signal component at the drain terminal of differential switch 126, would be AC-coupled by way of capacitor 140 to the path provided by resistor 142, in lieu of the gate terminals of switches 130, 132. For example, presuming an input impedance in the order of 20 MO at the respective gate terminal of switch pair 130,132 relative to a resistance value in the order of 2 MO for resistor 142, it would be appreciated that resistor-capacitor circuit 134 would effect a high-impedance path to such AC signal component (e.g., at the drain of differential switch 126), and this effectively increases the AC gain of the differential amplifier.

For biasing purposes, hybrid load circuitry 125 may include a first resistor 144 coupled from a source terminal of one of the switches of the second pair of semiconductor switches (e.g., switch 130) to a drain terminal of one of the switches of the first pair of semiconductor switches (e.g., differential switch 126). Hybrid load circuitry 125 may further include a second resistor 146 coupled from a source terminal of the other one of the switches (e.g., switch 132) of the second pair of semiconductor switches to a drain terminal of the other one of the switches of the first pair of semiconductor switches (e.g, differential switch 128). First and second resistors 144 and 146 each may comprise a positive temperature coefficient of resistance so that as temperature varies the gain of the amplifier remains substantially constant. That is, constant other than applicable tolerances and deviations, as would be understood by one skilled in the art in the context of a practical, real-world device. A node 148 connected to the source terminal of switch 132 provides the amplified differential amplifier output. Preliminary experimental results have demonstrated feasibility of differential gains of at least approximately 47.8 dB, 51.4 dB and 57.8 dB at temperatures of 450° C., 300° C. and 25° C., respectively.

FIG. 21 illustrates a block diagram of an example power source circuitry 239, which may be used in a turbine component (e.g., turbine blade 20 (FIG. 1)) instrumented with a telemetry system. In one example embodiment, one or more loads may be electrically powered by power source circuitry 239. By way of example, loads may be electronic circuitry, such as sensing (e.g., strain gauge 101), signal conditioning (e.g., differential amplifier 102), and/or telemetry circuitry (e.g., voltage controlled oscillator 104, buffer 105), which may be part of the telemetry system.

Power source circuitry 239 may acquire electrical power by way of one or more power-harvesting modalities, such as induced RF (radio frequency) energy and/or by harvesting thermal or vibrational power within the turbine engine. For example, thermopiles may be used to generate electricity from thermal energy, or piezoelectric materials may generate electricity from vibration of the turbine engine. For readers desirous of general background information regarding examples forms of power harvesting modalities, reference is made to U.S. Pat. No. 7,368,827, titled "Electrical Assembly For Monitoring Conditions In A Combustion Turbine Operating Environment", the entire disclosure of which is incorporated herein by reference.

Regardless of the specific power-harvesting modality, in one example embodiment AC (alternating current) power 241 may be supplied to a rectifier 242, which converts the AC input to a DC (direct current) output, which is coupled to a voltage regulator 244, which may be configured to maintain a relatively constant DC voltage output 245, even in the presence of variation of the harvested AC input voltage. It will be appreciated that a constant voltage output may be desired to achieve a required measurement accuracy and/or stability for any given engine parameter being measured.

Figure 23:
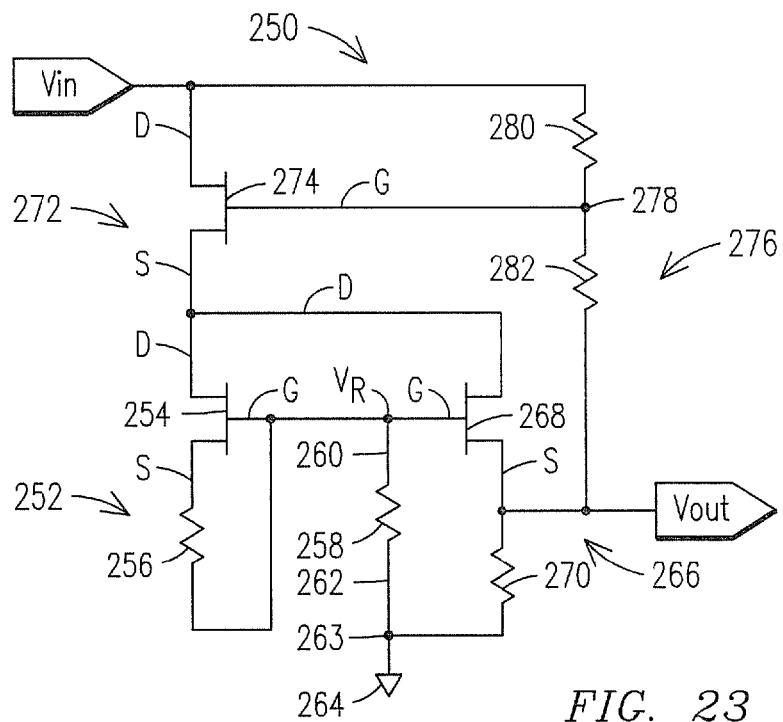
FIG. 23 is a schematic representation of one example embodiment of the voltage regulator.
Figure 24:
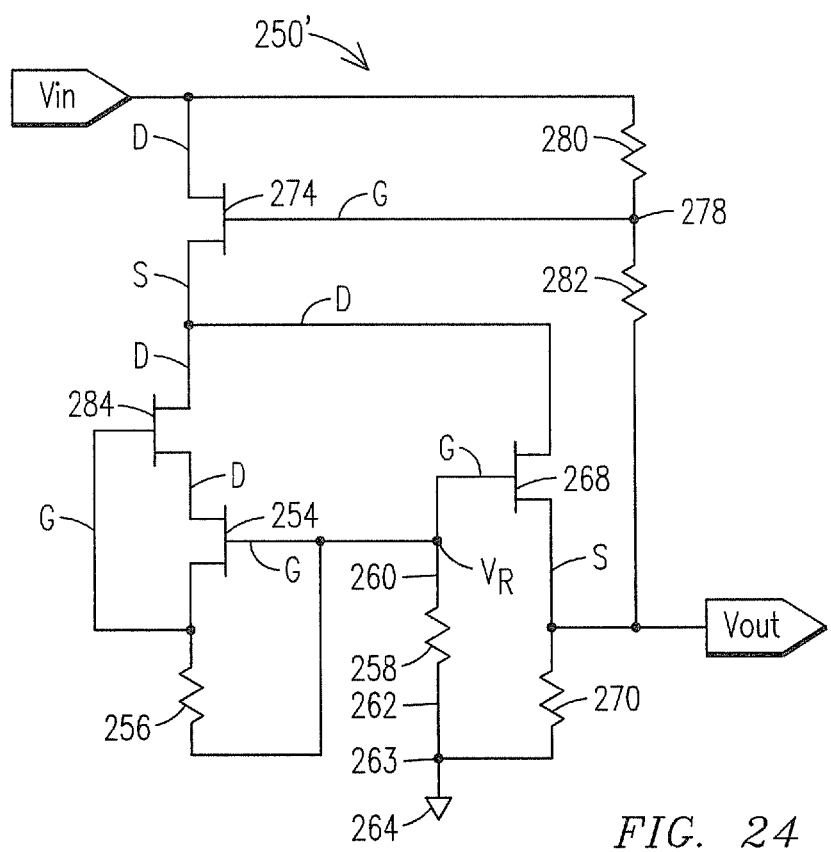
FIG. 24 is a schematic representation of another example embodiment of the voltage regulator.

FIGS. 23-24 and related description below will provide details of a voltage regulator 250 embodying aspects of the present invention, which in one example application, may be used in a power source circuitry, as exemplarily illustrated in FIG. 21. It will be appreciated that such example application should not be construed in a limiting sense being that circuitry embodying aspects of the present invention may be used in other applications.

In one example embodiment, voltage regulator 250 may be adapted to operate in a high-temperature environment of a turbine engine. Voltage regulator 250 may include a constant current source 252, such as may include a first semiconductor switch 254 and a first resistor 256 connected between a gate terminal (G) and a source terminal (S) of first semiconductor switch 254.

In one example embodiment, a second resistor 258 may have a first lead 260 connected to the gate terminal (G) of first semiconductor switch 254 and a second lead 262 connected through node 263 to an electrical ground 64. Constant current source 252 may be coupled to generate a voltage reference (Vr) across second resistor 258. A source follower output stage 266 may include a second semiconductor switch 268 and a third resistor 270 connected between electrical ground 264 and a source terminal (S) of second semiconductor switch 268. As can be appreciate in FIG. 23, first lead 260 of second resistor 258 is connected to apply the generated voltage reference (Vr) to a gating terminal (G) of second semiconductor switch 268. It can be further appreciated that the source terminal (S) of second semiconductor switch 268 supplies a regulated output voltage (e.g., voltage V1 in FIG. 22) of voltage regulator 250. It will be appreciated that node 263 need not be electrically grounded and in one example embodiment node 263 may constitute an output node arranged to provide a second source of regulated voltage (e.g., voltage V2 in FIG. 22, which may have a polarity opposite to the polarity of voltage V1).

In one example embodiment, current source 252 may further include an input stage 272, which may include a third semiconductor switch 274 having a drain terminal (D) connected to receive an input voltage (Vin) (e.g., output from rectifier 242 in FIG. 21) to be regulated by voltage regulator 250. A voltage divider network 276 may provide a voltage divider node 278 connected to a gate terminal (G) of third semiconductor switch 274. Voltage divider network 276 may include a first resistor 280 connected between voltage divider node 278 and the drain (D) of third semiconductor switch 274, and may further include a second resistor 282 connected between voltage divider node 278 and the source (S) of second semiconductor switch 268.

In an alternate embodiment illustrated in FIG. 24, in a voltage regulator 250', input stage 272 of current source 252 may further include a fourth semiconductor switch 284 connected in series circuit between first semiconductor switch 254 and third semiconductor switch 274. In this alternate embodiment, fourth semiconductor switch 284 may have a drain terminal (D) connected to the source terminal (S) of third semiconductor switch 274, a source terminal (S) connected to the drain terminal (D) of first semiconductor switch 254, and a gate terminal (G) connected to the source terminal (S) of first semiconductor switch 254. It will be appreciated that the cascaded arrangement of semiconductor switches 274 and 284 is conducive to a relatively more stable current regulation by current source 252, which in turn is conducive to a relative more stable voltage reference Vr, which constitutes a DC bias for third semiconductor switch 268 and consequently a relatively more stable regulated output voltage, Vout.

In one example embodiment, semiconductor switches 254, 268, 274 and 284 may be n-channel junction gate field-effect transistor (JFET) switches and may comprise a respective high-temperature, wide bandgap material, such as SiC, AlN, GaN, AlGaN, GaAs, GaP, InP, AlGaAs, AlGaP, AlInGaP, and GaAsAlN.

As will be appreciated by one skilled in the art, high-temperature voltage regulation, as would involve zener diodes made of a high-temperature, wide bandgap material is presently not feasible, since zener diodes involving high-temperature materials are not believed to be commercially available. Moreover, p-channel SiC JFETs are presently believed to be impractical in high-temperature applications due to their relatively low-channel mobility. Accordingly, circuitry embodying aspects of the present invention, advantageously overcomes the present unavailability of zener diodes made of high-temperature, wide bandgap materials with n-channel JFETs, and thus such a circuitry may operate within the theoretical temperature limits of high-temperature, wide bandgap material JFETs (e.g., above 500° C.) and effectively provide a substantially stable voltage regulator. In one example application, a voltage regulator in accordance with aspects of the present invention may be utilized to appropriately regulate a power source in a high-temperature environment for powering load circuitry involving relatively low-voltage information signals. For example, prior to the present invention, such load circuitry would have been susceptible to measurement uncertainties resulting from power source instabilities in view of the relatively low-magnitude (e.g., a few millivolts) of the information signals, which may be generated by sensors, such as thermocouples and strain gauges.

In one example embodiment, the magnitude of the regulated output voltage Vout may be adjustable by adjusting a ratio of the respective resistance values of first and second resistors 256 and 258. Typically, the output voltage of known voltage regulators is not adjustable, and, if so desired, for known voltage regulators an operational amplifier would be involved. However, for high-temperature applications, operational amplifiers made of high-temperature, wide bandgap materials are not believed to be available. Accordingly, a voltage regulator embodying aspects of the present invention in a simplified manner (e.g., with lesser active components) may be conveniently configured to adjust the magnitude of the regulated output voltage Vout, as may involve operation in a high-temperature environment. If optionally desired, a resistive temperature detector (RTD) or similar may be combined with the first and second resistors 256 and 258 to control the regulated output voltage Vout in accordance with temperature changes. It is contemplated that because of the improved stability and repeatability, which can be achieved with a voltage regulator embodying aspects of the present invention, any voltage regulation variation, which may be experienced by the voltage regulator under temperature changes would be consistently repeatable, which means any such voltage regulation variation resulting from temperature changes can be appropriately compensated using techniques well-understood by those skilled in the art.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A circuitry adapted to operate in a high-temperature environment of a turbine engine, the circuitry comprising:
a sensing element disposed on a component of the turbine engine to sense a parameter of the component and provide a voltage indicative of the sensed parameter;
a differential amplifier having an input terminal coupled to the sensing element to receive the voltage indicative of the sensed parameter;

wherein said differential amplifier comprises a first pair of semiconductor switches each having a respective gate bias network comprising a first resistive element having a positive temperature coefficient of resistance coupled between a voltage source and a respective gate terminal of a respective one of the semiconductor switches and a second resistive element having a zero temperature coefficient of resistance coupled between the respective gate terminal and electrical ground, wherein each respective gate bias network is arranged so that when temperature increases, a respective bias voltage at the respective gate terminals of the semiconductor switches decreases; and a hybrid load circuitry AC-coupled to the differential amplifier, wherein the differential amplifier and the hybrid load circuitry are disposed in the high-temperature environment of the turbine engine.

2. The circuitry of claim 1, wherein the hybrid load circuitry comprises a second pair of semiconductor switches, wherein the hybrid load circuitry further comprises a resistor-capacitor circuit arranged to provide a path to an AC signal component with respect to the drain terminal of the switch of the first pair of semiconductor switches, which receives the voltage indicative of the sensed parameter.

3. The circuitry of claim 2, wherein the resistor-capacitor circuit is connected to a node coupled in parallel circuit to the respective gate terminals of the second pair of semiconductor switches, wherein a resistor of the resistor-capacitor circuit has a first lead connected to the node and a second lead electrically grounded, wherein a capacitor of the resistor-capacitor circuit has a first lead connected to the node and a second lead connected to the drain terminal of the switch of the first pair of semiconductor switches, which receives the voltage indicative of the sensed parameter.

4. The circuitry of claim 2, wherein the hybrid load circuitry further comprises a first resistor coupled from a source terminal of one of the switches of the second pair of semiconductor switches to a drain terminal of one of the switches of the first pair of semiconductor switches, and a second resistor coupled from a source terminal of the other one of the switches of the second pair of semiconductor switches to a drain terminal of the other one of the switches of the first pair of semiconductor switches.

5. The circuitry of claim 4, wherein the respective first and second resistors each comprises a positive temperature coefficient of resistance so that a gain of said amplifier remains substantially constant notwithstanding an occurrence of a temperature variation.

6. The circuitry of claim 1, wherein the differential amplifier comprises a single stage differential amplifier.

7. The circuitry of claim 2, wherein the respective first and second pairs of semiconductor switches comprise circuitry without complementary pairs of semiconductor switches.

8. The circuitry of claim 2, wherein the respective first and second pairs of semiconductor switches comprise n-channel junction field-effect transistor (JFET) switches.

9. The circuitry of claim 2, wherein the respective first and second pairs of semiconductor switches comprise a respective high-temperature, wide bandgap material.

10. The circuitry of claim 9, wherein the high-temperature, wide bandgap material is selected from the group consisting of SiC, AlN, GaN, AlGaN, GaAs, GaP, InP, AlGaAs, AlGaP, AlInGaP, and GaAsAlN.

11. The circuitry of claim 1, wherein the sensing element comprises a strain gauge to sense a strain of the component, and the voltage is indicative of the sensed strain of the component.

12. A telemetry system comprising the circuitry of claim 1.

13. A circuitry adapted to operate in a high-temperature environment, the circuitry comprising:
a differential amplifier having an input terminal coupled to receive a voltage indicative of a sensed parameter of a component in the high-temperature environment;
a hybrid load circuitry AC-coupled to the differential amplifier;
a voltage regulator circuitry coupled to power the differential amplifier, wherein the differential amplifier, the hybrid load circuitry and the voltage regulator circuitry are disposed in the high-temperature environment.

14. The circuitry of claim 13, wherein the voltage regulator circuitry comprises a constant current source comprising at least a first semiconductor switch and a first resistor connected between a gate terminal and a source terminal of the first semiconductor switch, the constant current source further comprising a cascaded input stage connected to receive an input voltage to be regulated by the voltage regulator;
a second resistor having a first lead connected to the gate terminal of the first semiconductor switch and a second lead connected to an output node of the regulator, wherein the constant current source is coupled to provide a voltage reference across the second resistor; and
a source follower output stage comprising a second semiconductor switch and a third resistor connected between the output node and a source terminal of the second semiconductor switch, wherein the first lead of the second resistor is connected to apply the generated voltage reference to a gating terminal of the second semiconductor switch.

15. The circuitry of claim 14, wherein the source terminal of the second semiconductor switch supplies a first regulated output voltage of the voltage regulator.

16. The circuitry of claim 14, wherein the output node supplies a second regulated output voltage of the voltage regulator, wherein the second regulated output voltage comprises a different polarity relative to a polarity of the first regulated output voltage.

17. The circuitry of claim 14, wherein the current source further comprises an input stage comprising a third semiconductor switch having a drain terminal connected to receive an input voltage to be regulated by the voltage regulator.

18. The circuitry of claim 17, further comprising a voltage divider network having a voltage divider node connected to a gate terminal of the third semiconductor switch, wherein the voltage divider network comprises a first resistor connected between the voltage divider node and the drain of the third semiconductor switch, and a second resistor connected between the voltage divider node and the source of the second semiconductor switch.

19. The circuitry of claim 17, wherein the input stage of the current source further comprises a fourth semiconductor switch connected in series circuit between the first and third semiconductor switches, wherein the fourth semiconductor switch has a drain terminal connected to a source terminal of the third semiconductor switch, a source terminal connected to a drain terminal of the first semiconductor switch, and a gate terminal connected to the source terminal of the first semiconductor switch.

20. The circuitry of claim 13, wherein said differential amplifier comprises a first pair of semiconductor switches each having a respective gate bias network comprising a first resistive element having a positive temperature coefficient of resistance coupled between a voltage source and a respective gate terminal of a respective one of the semiconductor switches and a second resistive element having a zero temperature coefficient of resistance coupled between the respective gate terminal and electrical ground, wherein each respective gate bias network is arranged so that when temperature increases, a respective bias voltage at the respective gate terminals of the semiconductor switches decreases.

21. The circuitry of claim 13, wherein the hybrid load circuitry comprises a second pair of semiconductor switches, wherein the hybrid load circuitry further comprises a resistor-capacitor circuit arranged to provide a path to an AC signal component with respect to the drain terminal of the switch of the first pair of semiconductor switches, which receives the voltage indicative of the sensed parameter.

22. The circuitry of claim 21, wherein the resistor-capacitor circuit is connected to a node coupled in parallel circuit to the respective gate terminals of the second pair of semiconductor switches, wherein a resistor of the resistor-capacitor circuit has a first lead connected to the node and a second lead electrically grounded, wherein a capacitor of the resistor-capacitor circuit has a first lead connected to the node and a second lead connected to the drain terminal of the switch of the first pair of semiconductor switches, which receives the voltage indicative of the sensed parameter.

23. The circuitry of claim 21, wherein the hybrid load circuitry further comprises a first resistor coupled from a source terminal of one of the switches of the second pair of semiconductor switches to a drain terminal of one of the switches of the first pair of semiconductor switches, and a second resistor coupled from a source terminal of the other one of the switches of the second pair of semiconductor switches to a drain terminal of the other one of the switches of the first pair of semiconductor switches.

24. The circuitry of claim 23, wherein the respective first and second resistors each comprises a positive temperature coefficient of resistance so that a gain of said amplifier remains substantially constant notwithstanding an occurrence of a temperature variation.

25. The circuitry of claim 20, wherein each of the semiconductor switches of said differential amplifier and said voltage regulator comprise n-channel junction field-effect transistor (JFET) switches.

26. A telemetry system comprising the circuitry of claim 13.

27. A circuitry adapted to operate in a high-temperature environment of a turbine engine, the circuitry comprising:
a differential amplifier having an input terminal coupled to receive a voltage indicative of a sensed parameter regarding a component of the turbine engine;
a hybrid load circuitry AC-coupled to the differential amplifier;
wherein said differential amplifier comprises a first pair of semiconductor switches each having a respective gate bias network comprising a first resistive element having a positive temperature coefficient of resistance coupled between a voltage source and a respective gate terminal of a respective one of the semiconductor switches and a second resistive element having a zero temperature coefficient of resistance coupled between the respective gate terminal and electrical ground, wherein each respective gate bias network is arranged so that when temperature increases, a respective bias voltage at the respective gate terminals of the semiconductor switches decreases; and
a voltage regulator circuitry coupled to power the differential amplifier, wherein the differential amplifier, the hybrid load circuitry and the voltage regulator circuitry are disposed in the high-temperature environment of the turbine engine;
wherein the voltage regulator circuitry comprises:
a constant current source comprising at least a first semiconductor switch and a first resistor connected between a gate terminal and a source terminal of the first semiconductor switch, the constant current source further comprising a cascaded input stage connected to receive an input voltage to be regulated by the voltage regulator;
a second resistor having a first lead connected to the gate terminal of the first semiconductor switch and a second lead connected to an output node of the regulator, wherein the constant current source is coupled to provide a voltage reference across the second resistor; and
a source follower output stage comprising a second semiconductor switch and a third resistor connected between the output node and a source terminal of the second semiconductor switch, wherein the first lead of the second resistor is connected to apply the generated voltage reference to a gating terminal of the second semiconductor switch, wherein the source terminal of the second semiconductor switch supplies a first regulated output voltage of the voltage regulator, and wherein the output node supplies a second regulated output voltage of the voltage regulator, wherein the second regulated output voltage comprises a different polarity relative to a polarity of the first regulated output voltage.

\* \* \* \* \*